(12) United States Patent
Vimercati

(10) Patent No.: US 10,504,909 B2
(45) Date of Patent: Dec. 10, 2019

(54) PLATE NODE CONFIGURATIONS AND OPERATIONS FOR A MEMORY ARRAY

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/969,302

(22) Filed: May 2, 2018

(65) Prior Publication Data

US 2018/0331114 A1    Nov. 15, 2018

Related U.S. Application Data

(60) Provisional application No. 62/504,299, filed on May 10, 2017.

(51) Int. Cl.
| | |
|---|---|
| *H01L 27/11514* | (2017.01) |
| *G11C 11/22* | (2006.01) |
| *H01L 27/11507* | (2017.01) |
| *G11C 5/02* | (2006.01) |

(52) U.S. Cl.
CPC ........ *H01L 27/11514* (2013.01); *G11C 5/025* (2013.01); *G11C 11/221* (2013.01); *G11C 11/2259* (2013.01); *G11C 11/2273* (2013.01); *G11C 11/2275* (2013.01); *G11C 11/2293* (2013.01); *H01L 27/11507* (2013.01); *G11C 2213/71* (2013.01)

(58) Field of Classification Search
CPC ......... H01L 27/11514; H01L 27/11507; G11C 5/025; G11C 11/2293; G11C 11/2275; G11C 11/2273; G11C 11/221; G11C 11/2259; G11C 2213/71
USPC ........................................................ 365/65
See application file for complete search history.

(56) References Cited

U.S. PATENT DOCUMENTS

| | | | |
|---|---|---|---|
| 7,649,763 B2 * | 1/2010 | Takashima | G11C 11/22 257/245 |
| 9,613,676 B1 | 4/2017 | Wang et al. | |
| 2004/0245547 A1 | 12/2004 | Stipe | |

(Continued)

OTHER PUBLICATIONS

ISA/KR, International Search Report and Written Opinion of the International Search Authority, Int'l. Appl. No. PCT/US2018/031745, dated Sep. 11, 2018, Korean Intellectual Property Office, Seo-gu, Daejeon, Republic of Korea, 15 pgs.

*Primary Examiner* — Fernando Hidalgo
(74) *Attorney, Agent, or Firm* — Holland & Hart LLP

(57) ABSTRACT

Methods, systems, and devices for plate node configurations and operations for a memory array are described. A single plate node of a memory array may be coupled to multiple rows or columns of memory cells (e.g., ferroelectric memory cells) in a deck of memory cells. The single plate node may perform the functions of multiple plate nodes. The number of contacts to couple the single plate node to the substrate may be less than the number of contacts to couple multiple plate nodes to the substrate. Connectors or sockets in a memory array with a single plate node may define a size that is less than a size of the connectors or sockets with multiple plate nodes. In some examples, a single plate node of the memory array may be coupled to multiple lines of a memory cells in multiple decks of memory cells.

23 Claims, 13 Drawing Sheets

(56) References Cited

U.S. PATENT DOCUMENTS

2009/0168490 A1    7/2009  Madan
2010/0097839 A1    4/2010  Kim
2010/0321988 A1*  12/2010  Wells .................... G11C 5/02
                                                              365/163
2014/0239512 A1    8/2014  Pellizzer et al.

* cited by examiner

PLATE NODE CONFIGURATIONS AND
OPERATIONS FOR A MEMORY ARRAY

CROSS REFERENCE

The present application for patent claims the benefit of U.S. Provisional Patent Application No. 62/504,299 by Vimercati, entitled "Plate Node Configurations and Operations for a Memory Array," filed May 10, 2017, assigned to the assignee hereof, and is expressly incorporated by reference in its entirety herein.

BACKGROUND

The following relates generally to plate node configurations and operations for a memory array and more specifically plate node configurations in a memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Three-dimensional arrays may be desirable for addressing these issues, but benefits may be hampered by replicating two-dimensional architecture features, such as plate line configurations.

DETAILED DESCRIPTION

In a memory array a single plate node may be coupled to memory cells associated with multiple digit lines in the array. A quantity of plate nodes within an array may thus be reduced relative to alternative architectures. In some examples, a single plate node may be coupled to memory cells associated with multiple decks of the memory array. Unlike a two-dimensional architecture, for example, multiple decks of an array may be accessed using a common plate node.

By way of example, in some memory arrays, multiple decks of memory cells may be positioned above a substrate. The substrate may include various support components used to operate the memory array including, for example, decoders, amplifiers, drivers, etc. When an upper deck of memory cells is stacked on top of a lower deck of memory cells, contacts for the components of the upper deck may pass through spaces that could be used for components of the lower deck of memory cells. As such, space in the memory array may be allocated to connectors or sockets that couple the plate lines and other components to the substrate.

A single plate node of a memory array may be coupled to multiple lines of memory cells in a memory cells. In some examples, the single plate node may be common to memory cells in the same section, same tile, same deck, or even memory cells in multiple decks. In such examples, a single plate node may perform the functions of multiple plate nodes. The number of contacts to couple the single plate node to the substrate may be less than the number of contacts to couple multiple plate nodes to the substrate. Connectors or sockets in a memory array with a single plate node may define a size that is less than a size of the connectors or sockets with multiple plate nodes. In some examples, a single plate nodes of the memory array may be coupled to multiple lines of a memory cells in multiple decks of memory cells.

Features of the disclosure introduced above are further described below in the context of FIGS. 1-13. The features of the disclosure are illustrated by and described with reference to apparatus diagrams, system diagrams, and flowcharts that relate to plate configurations and operations for a memory array.

Figure 1:
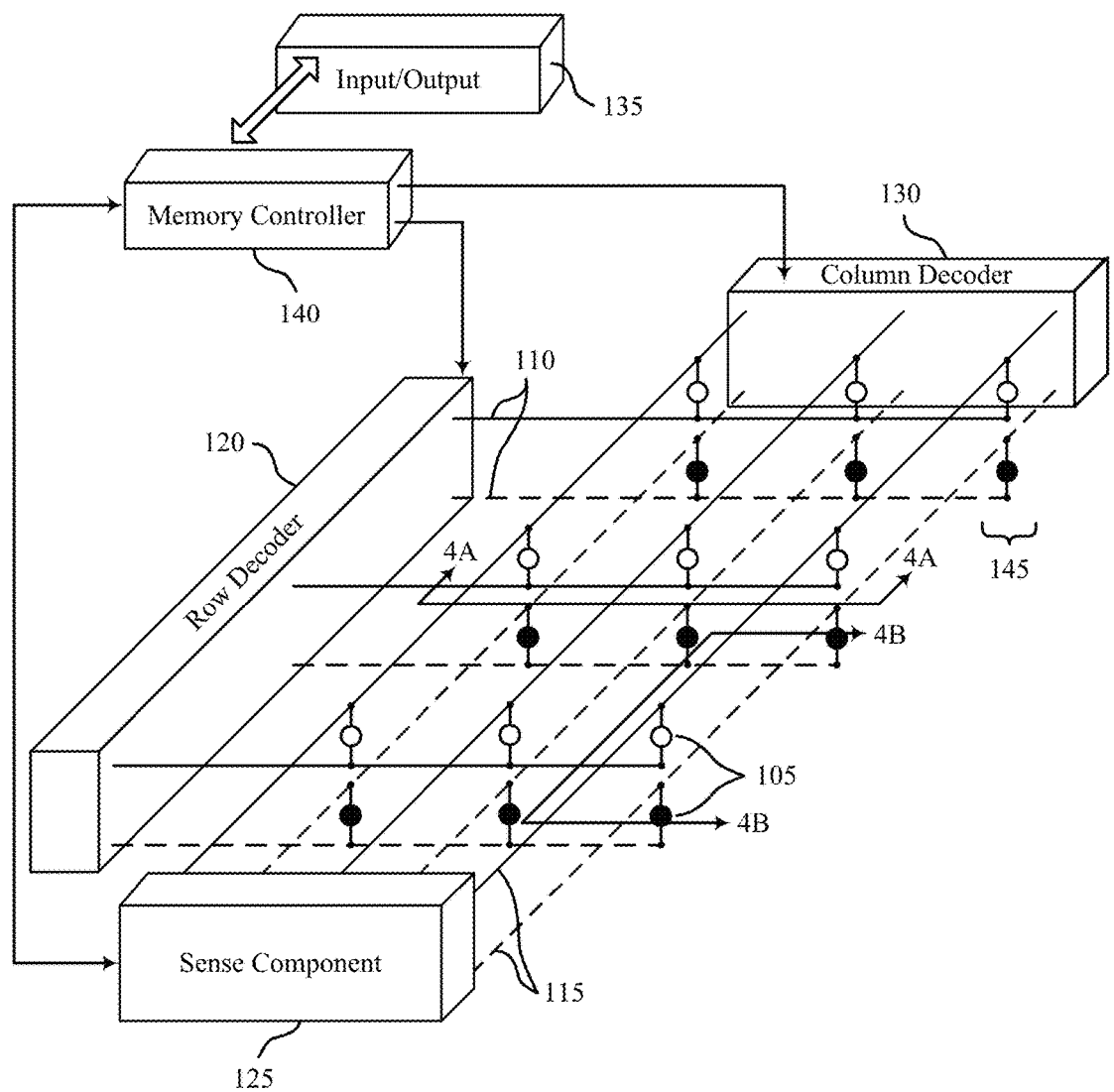
FIG. 1 illustrates an example of a memory array that supports plate node configurations and operations for a memory array in accordance with embodiments of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110, and each column of memory cells 105 is connected to a bit line 115. Access lines 110 and bit lines 115 may be substantially perpendicular to one another to create an array. In addition, each row of memory cells 105 may be coupled to plate lines (not shown). As used herein, the terms plate node, plate line, or simply plate may be used interchangeably. As shown in FIG. 1, each memory cell 105 in a memory cell stack 145 may be coupled to separate conductive lines such as bit lines 115. In other examples (not shown), two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third deck may share an access line 110 with a lower deck. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting access line 110 and digit line 115. Access lines 110 may also be known as word lines 110, and bit lines 115 may also be known as digit lines 115. In some examples, the term access line may refer to word lines, bit lines, digit lines, or plate lines. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Upon selecting a memory cell 105, the resulting signal may be used to determine the stored logic state.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, and multiple digit lines 115. Thus, by activating a word line 110 and a digit line 115, the memory cell 105 at their intersection may be accessed. As is described in more detail below, by coupling a single plate to multiple lines (e.g., rows or columns) of memory cells, the access operations to the memory cells may be modified. For example, during an idle period the plate line and the digit line of a memory cell may be maintained at a non-zero voltage. In another example, during an access operation, digit lines coupled to unselected memory cells may be selectively coupled to the plate to mitigate unwanted transient voltages.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. Exemplary access operations for ferroelectric memory cells are described below with reference to FIGS. 2 and 3.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. As described in more detail below, unselected memory cells may be shunted to the plate to mitigate unwanted transient voltages.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. But in non-volatile memory, such as an array that employs ferroelectrics, accessing the memory cell 105 may not destroy the logic state and, thus, the memory cell 105 may not require re-writing after accessing. In some examples, multiple levels of memory cells may be coupled to the same plate. Such a plate configuration may result in a smaller amount of area used to connect higher levels memory cells to the substrate.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, decharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
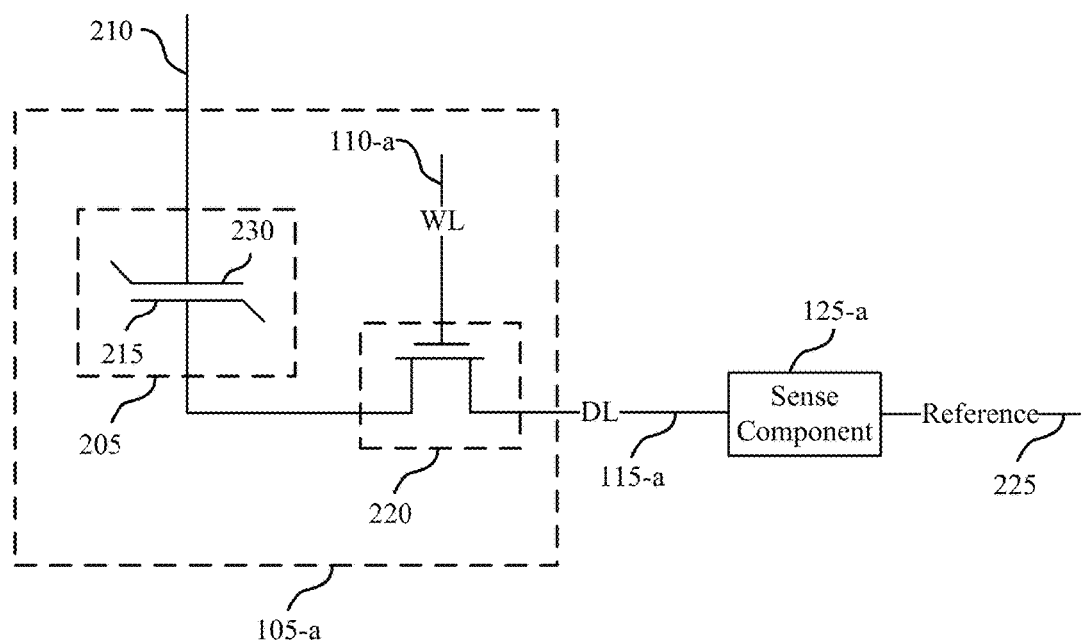
FIG. 2 illustrates an example of a circuit that supports plate node configurations and operations for a memory array in accordance with embodiments of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. In some cases, some memory cells 105-a may share access lines (e.g., digit lines, word lines, plate lines) with other memory cells. For example, a digit line 115-a may be shared with memory cells 105-a in a same column, a word line 110-a may be shared with memory cells 105-a in the same row, and a plate line 210 may be shared with memory cells 105-a in the same section, tile, deck, or even multiple decks. As described above, various states may be stored by charging or discharging the capacitor 205. In many examples, a connector or socket may be used to couple digit lines 115-a or plate lines 210 of upper level levels of memory cells to a substrate positioned below the arrays of memory cells. The size of the connector or socket may be modified based on the configuration of the plate lines in the memory array.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate the selection component 220; for example, a voltage applied to word line 110-a is applied to the transistor gate, connecting capacitor 205 with digit line 115-a. As is described in more detail below, the access operations (e.g., read operation or write operation) may be modified based on the plate configuration of the memory array.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate." As is described in more detail below, the access operations (e.g., read operation or write operation) may be modified based on the plate configuration of the memory array.

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
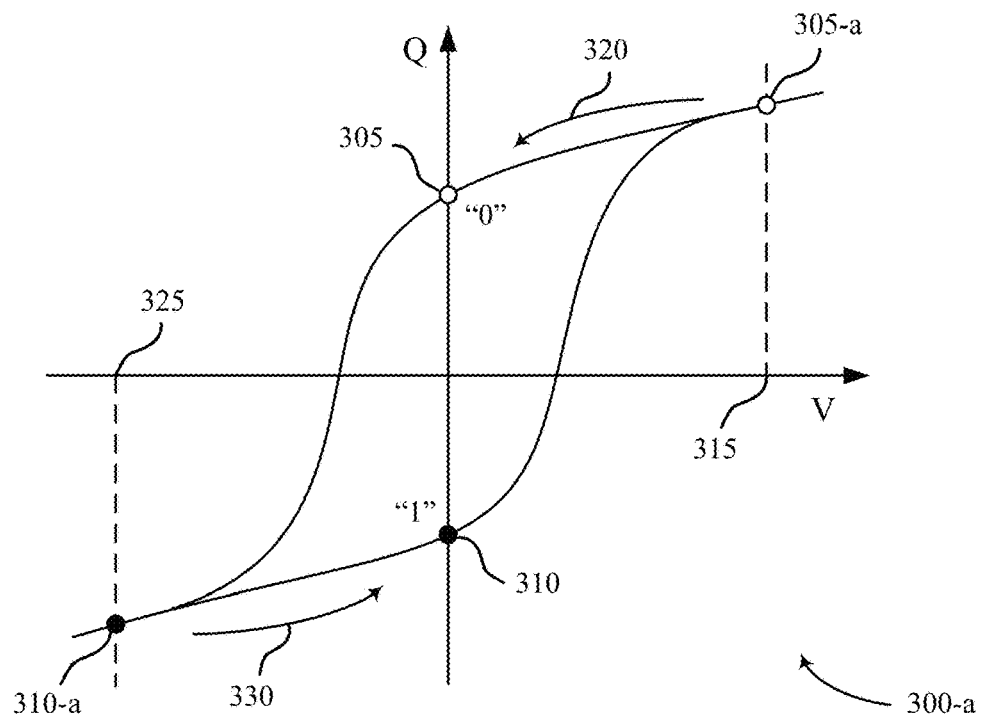
FIG. 3 illustrates an example of hysteresis curves that support plate node configurations and operations for a memory array in accordance with embodiments of the present disclosure.
Figure 3:
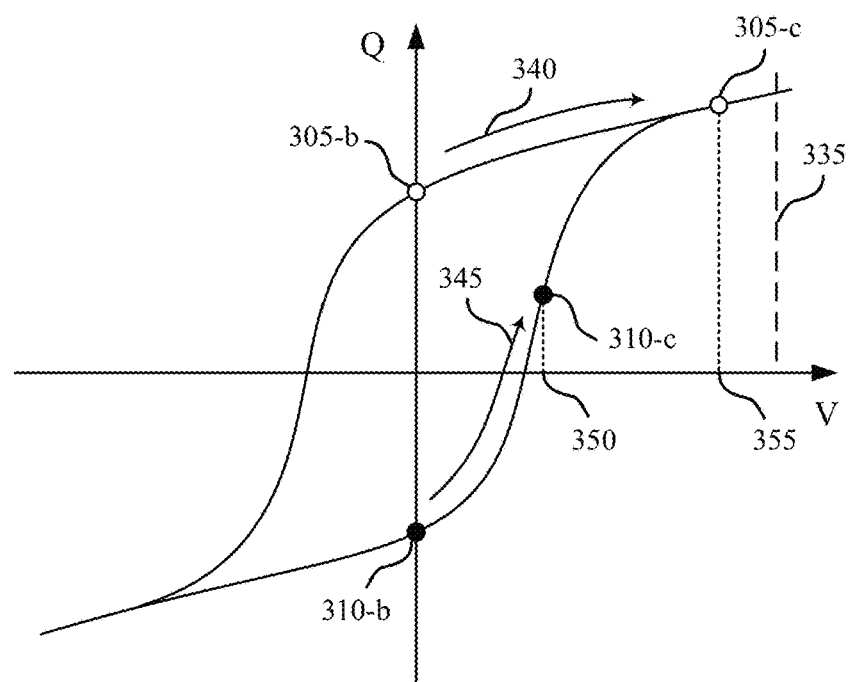

FIG. 3 illustrates an example of non-linear electrical properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335—voltage 350) or (voltage 335—voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335—voltage 350) and (voltage 335—voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

In some examples of ferroelectric memory arrays, a plate line may be a coupled to multiple lines of memory cells. In such configurations, die area may be used more efficiently and allocated to additional memory cells. Various examples of plate line configurations are described herein and access operations associated with those configurations is also described herein.

Figure 4A:
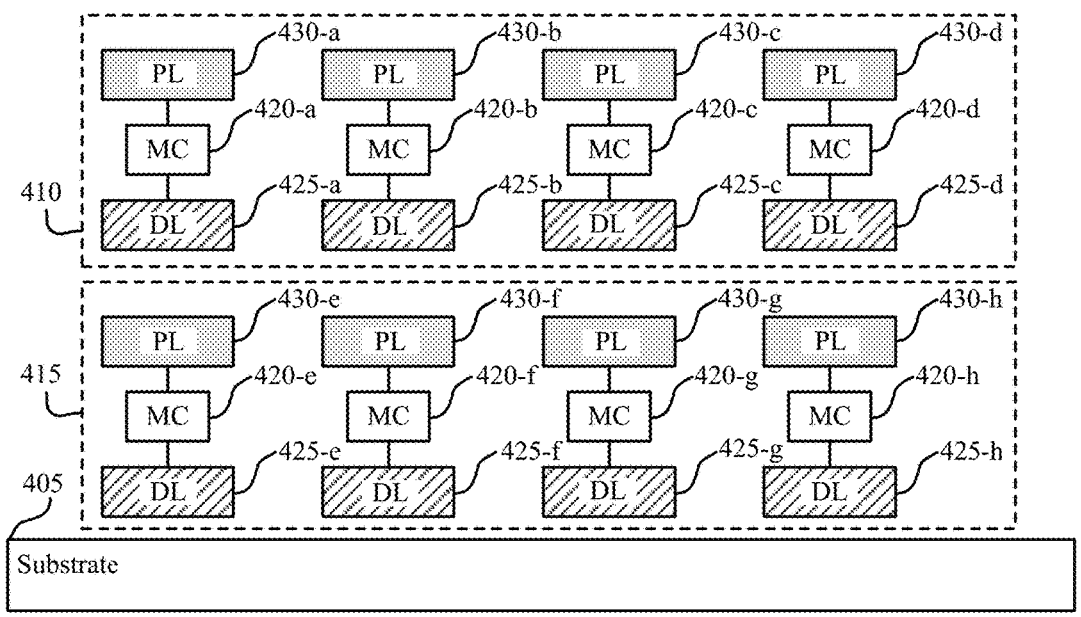
FIG. 4A illustrates an example of a first cross-section view of a memory array that supports plate node configurations and operations for a memory array in accordance with embodiments of the present disclosure.

FIG. 4A illustrates an example of first cross-section view of a memory array 400 that supports plate node configurations and operations for a memory array in accordance with various embodiments of the present disclosure. In the example of the memory array 100 described with reference to FIG. 1, the cross-section view of the memory array 400 may be taken along line 4A-4A shown in FIG. 1. As such, the digit lines and the plate lines of the memory array 400 extend into or extend out of the page.

The memory array 400 may include a substrate 405, a first deck 410 of memory cells 420, and a second deck 415 of memory cells 420. The second deck 415 may be positioned between the substrate 405 and the first deck 410. The memory array 400 may be an example of the memory array 100 described with reference to FIG. 1. The first deck 410 and the second deck 415 may be examples of levels of memory cells described with reference to FIG. 1.

Each deck 410, 415 may include plurality of memory cells 420, digit lines 425, plate lines 430 and other components and access lines that are not shown. The memory cells 420 may include a capacitor (not shown) and a selection component (not shown). In some examples, a word line (not shown) may extend perpendicular to the digit lines 425 and the plate lines 430. In some examples, depending on the array architecture, word lines may be connected to a selection component either placed between the memory cell 420 and digit line 425 or between memory cell 420 and the plate line 430. The memory cells 420 may be examples of the memory cells 105 described with reference to FIGS. 1 and 2. In some examples, the memory cells 420 are ferroelectric memory cells. In other examples, the memory cells 420 may be dielectric memory cells. Each deck 410, 415 is shown as having four memory cells for illustrative purposes only. A deck may include any number of memory cells and access lines.

Each memory cell 420 is coupled to a digit line 425 and a plate line 430. Each digit line 425 may be coupled to multiple memory cells 420. Each plate line 430 may be coupled to multiple memory cells 420. For example, the digit line 425-a and the plate line 430-a may extend outward from the plane of the page and couple to an additional memory cell adjacent to the memory cell 420-a. The digit line 425 may be an example of the digit line 115 described with reference to FIGS. 1 and 2. The plate line 430 may be an example of the plate line 210 described with reference to FIG. 2.

The substrate 405 may be positioned below the decks 410, 415 of memory cells 420 and access lines (e.g., digit lines 425 and/or plate lines 430). The substrate 405 may include components to support operations of the memory cells 420. For example, the substrate 405 may include decoders, amplifiers, drivers, etc. A memory controller 140 may be coupled to the various components of the substrate 405 to perform operations on the memory cell 420. In the memory array 400 that includes multiple decks of cells, connectors must pass through intervening layers of memory cells, access lines, or decks to reach certain components.

Figure 4B:
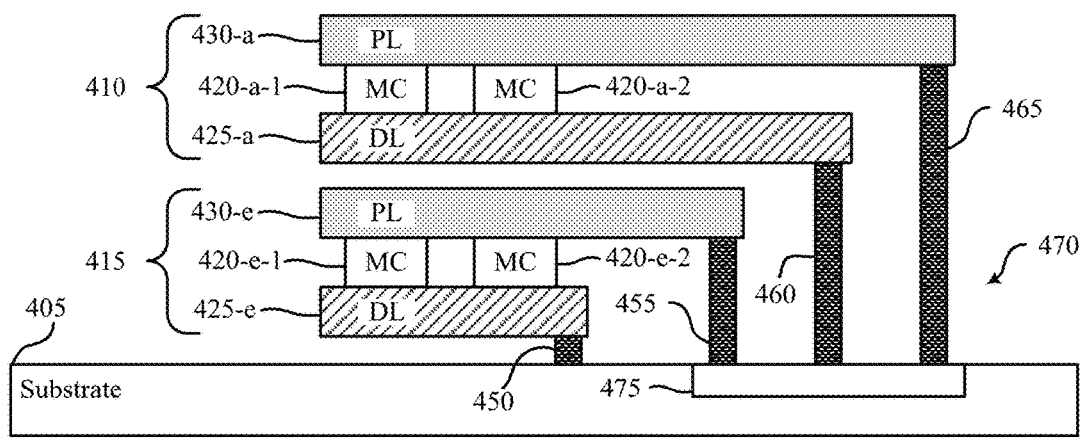
FIG. 4B illustrates an example of a second cross-section view of the memory array of FIG. 4A that supports plate node configurations and operations for a memory array in accordance with embodiments of the present disclosure.

FIG. 4B illustrates an example of a second cross-section view of the memory array 400-a of FIG. 4A that supports plate node configurations and operations for a memory array in accordance with embodiments of the present disclosure. The memory array 400-a of FIG. 4B may be an example of the memory array 400, albeit illustrated from a different perspective. In the example of the memory array 100 described with reference to FIG. 1, the cross-section view of the memory array 400 may be taken along line 4B-4B shown in FIG. 1. As such, the digit lines and the plate lines of the memory array 400 extend horizontally across the page. In some examples, word lines (not shown) may extend outward from the plane of the page and couple to respective selection components of each memory cell (not shown).

The memory array 400-a includes the substrate 405, a portion of the first deck 410, and a portion of the second deck 415. Specifically, the memory array 400-a depicts the memory cell 420-a from the first deck 410 and memory cells 420-e from the second deck 415 and their associated digit lines 425 and plate lines 430. While the digit lines 425-a, 425-e are illustrated as being coupled to two memory cells (420-a-1, 420-a-2 and 420-e-1, 420-e-2), the digit lines 425 and the plate lines 430 may be coupled to any number of memory cells 420. Two memory cells 420 are provided for illustrative purposes only.

A contact 450 may couple the digit line 425-e to the substrate 405. The contact 450 may be configured to provide electronic communication between the digit line 425-e and the support components positioned in the substrate 405 (e.g., decoders, amplifiers, drivers, etc.). In some examples, the contact 450 may be an example of a via. The contact 450 may be positioned in the memory array 400-a without disrupting or disturbing other components of the memory array 400-a (e.g., digit line 425-a, plate line 430-a, or plate line 430-e).

A contact 455 may couple the plate line 430-e to the substrate 405. The contact 455 may be configured to provide electronic communication between the plate line 430-e and the support components positioned in the substrate 405 (e.g., decoders, amplifiers, drivers, etc.). In some examples, the contact 455 may be an example of a via. In some examples, the contact 455 may pass through the digit line 425-e. In some examples, the digit line 425-e may be terminated to allow the contact 455 to couple the substrate 405 to the plate line 430-e. In some examples, a pattern of memory cells 420-e may be interrupted to discontinued to allow the contact 455 to pass through.

A contact 460 may couple the digit line 425-a to the substrate 405. The contact 460 may be configured to provide electronic communication between the digit line 425-a and the support components positioned in the substrate 405 (e.g., decoders, amplifiers, drivers, etc.). In some examples, the contact 460 may be an example of a via. Like the contact 455, in some examples, the contact 460 may pass through other components to reach the substrate 405. In some examples, the plate line 430-e, a pattern of the memory cells 420-e, the digit line 425-e, or combinations thereof may be terminated, interrupted, and/or discontinued to allow the contact 460 to pass through.

A contact 465 may couple the plate line 430-a to the substrate 405. The contact 465 may be configured to provide electronic communication between the plate line 430-a and the support components positioned in the substrate 405 (e.g., decoders, amplifiers, drivers, etc.). In some examples, the contact 465 may be an example of a via. Like the contacts 455, 460, in some examples, the contact 465 may pass through other components to reach the substrate 405. In some examples, a pattern of memory cells 420-a, the digit line 425-a, the plate line 430-e, a pattern of the memory cells 420-e, the digit line 425-e, or combinations thereof may be terminated, interrupted, and/or discontinued to allow the contact 465 to pass through. In some instances, other conductive paths (not shown) may be configured to provide electronic communication between the support components positioned in the substrate 405 and respective digit lines 425 and/or plate lines 430. For example, these other conductive paths may include contacts or vias to higher level metal connections and contacts or vias to silicon substrates (e.g., digit lines 425 and/or plate lines 435 may be staggered to ensure that topmost decks/levels are inside a footprint of layers positioned below, rather than extending outward beyond the footprint of layers positioned below.

The contacts 455, 460, 465 may cooperate with the substrate 405 to form a connector 470. In some examples, the connect 470 may be referred to as a socket or a substrate connector. To reduce disruptions to arrays of memory cells, contacts 455, 460, 465 may be located in groups. Such groupings may reduce the area of the memory array used to connect higher components and access lines to lower components and access lines. In some examples, the connector 470 may refer to one of these groups. In some examples, the connector 470 may refer to a portion 475 of the substrate 405 configured to receive contacts from high layers or decks. In some examples, the connector 470 may include the contacts 455, 460, 465, other contacts, the portion 475 of the substrate 405, or combinations thereof. The memory array 400 may include a plurality of connectors 470 based at least in part on the number of lines of memory cells in the memory array 400.

Figure 4C:
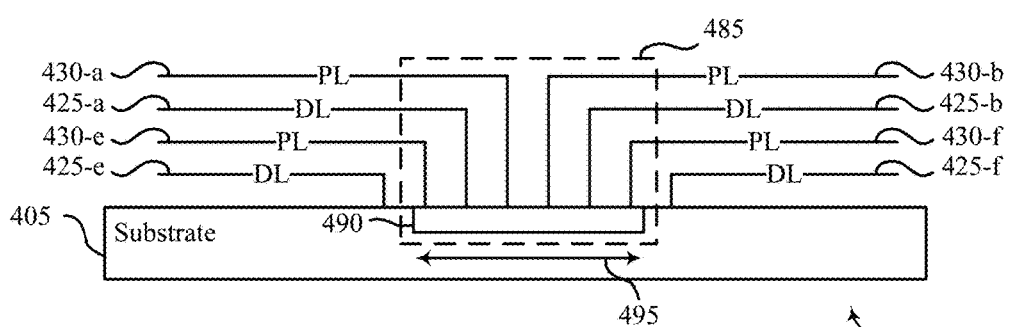
FIG. 4C illustrates an example of a connector that supports plate node configurations and operations for a memory array in accordance with embodiments of the present disclosure.

FIG. 4C illustrates an example of a circuit 480 that supports plate node configurations and operations for a memory array in accordance with embodiments of the present disclosure. The circuit 480 includes an example of a connector 485 that may be used in the memory array 400. The connector 485 may be configured to couple two cell stacks of components to the substrate 405. For example, the connector 485 may couple access lines associated with memory cell 420-a, memory cell 420-b, memory cell 420-e, and memory cell 420-f, to the substrate 405. As used herein, access lines may refer to digit lines, word lines, or plate lines. The circuit 480 illustrates a simplified circuit diagram of the memory array 400. The connector 485 may be an example of the connector 470 described with reference to FIG. 4B.

The connector 485 may include a contact for the plate line 430-a, a contact for the digit line 425-a, a plate line 430-e, a contact for the plate line 430-b, a contact for the digit line 425-b, a contact for the plate line 430-f, or combinations thereof. The connector 485 may also include a portion 490 of the substrate 405. The connector 485 may define a size 495. The size 495 may indicate an amount of area of the memory array 400 used to couple the components and access lines of higher layers decks to the substrate 405. In some examples, the size 495 may be a first dimension measure along a first axis. In some examples, the size 495 may be a two-dimensional area. In some examples, the size 495 may be a three-dimensional volume. The memory array 400 may include a plurality of connectors 485 based at least in part on the number of lines of memory cells in the memory array 400.

Figure 5A:
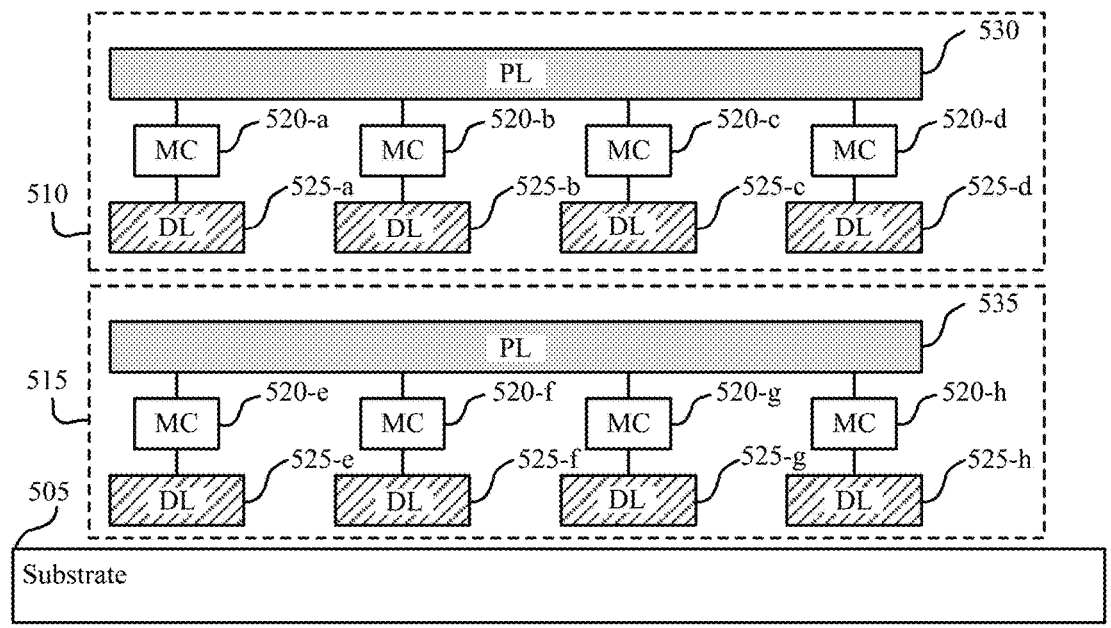
FIG. 5A illustrates an example of a memory array that supports plate node configurations and operations for a memory array in accordance with embodiments of the present disclosure.

FIG. 5A illustrates an example of a memory array 500 that supports plate node configurations and operations for a memory array in accordance with various embodiments of the present disclosure. In the example of the memory array 100 described with reference to FIG. 1, the cross-section view of the memory array 500 may be taken along line 4A-4A shown in FIG. 1. As such, the digit lines and the plate lines of the memory array 500 extend into or extend out of the page.

The memory array 500 may be an example of the memory array 400 described with reference to FIGS. 4A-4C. As such, full descriptions of at least some of the components of the memory array 500 are not repeated here. The memory array 500 may include a substrate 505, a first deck 510 of memory cells 520, and a second deck 515 of memory cells 520. The memory cells 520 may be coupled to digit lines 525 and plates 530, 535. The substrate 505 may be an example of the substrate 405 described with reference to FIGS. 4A-4C. The decks 510, 515 of memory cells 520 may be examples of the decks 410, 415 described with reference to FIGS. 4A-4B. The memory cells 520 may be examples of the memory cells 105 and memory cells 420 described with reference to FIGS. 1, 2, 4A, and 4B. The digit lines 525 may be examples of the digit lines 115 and digit lines 425 described with reference to FIGS. 1, 2, 4A, and 4B.

The memory array 500 may include a first plate line 530 associated with the first deck 510. The first plate line 530 may couple to multiple lines of memory cells (e.g., memory cells 520-*a*, 520-*b*, 520-*c*, 520-*d*). As shown in FIGS. 4A and 4B, a single plate line 430-*a* is coupled to a single line of memory cells 420-*a*. In some examples, the single plate line 430-*a* is associated with a single digit line 425-*a*, where the memory cells 420-*a* coupled to the digit line 425-*a* are also coupled to the plate line 430-*a*.

The first plate line 530 may be configured to bias a plurality of lines of memory cells 520. As such, the first plate line 530 may be associated with multiple digit lines (e.g., digit lines 525-*a*, 525-*b*, 525-*c*, 525-*d*). In effect, there may be a one-to-many mapping of the first plate line 530 to the digit lines 525. In contrast, the memory array 400 includes an individual plate line 430 for every individual digit line 425. In effect, a one-to-one mapping of the plate lines 430 to the digit lines 425. In some examples, the first plate line 530 (and the second plate line 535) may be formed as sheets of material that are coupled to multiple rows or columns of memory cells 520. The plate lines 530, 535 may be formed of a conductive or metallic material using a variety of methods. The plate lines 530, 535 may be formed by deposition and patterning (e.g., etching of conductive/metallic materials or compounds).

The memory array 500 may include a second plate line 535 associated with the second deck 515. The second plate line 535 may couple to multiple lines of memory cells (e.g., memory cells 520-*e*, 520-*f*, 520-*g*, 520-*h*). The second plate line 535 may be configured to bias a plurality of lines of memory cells 520. The second plate line 535 may be associated with multiple digit lines (e.g., digit lines 525-*e*, 525-*f*, 525-*g*, 525-*h*). In effect, there is a one-to-many mapping of the second plate line 535 to the digit lines 525. In contrast, the memory array 400 includes an individual plate line 430 for every individual digit line 425. In effect, a one-to-one mapping of the plate lines 430 to the digit lines 425.

The configurations of the first plate line 530 and the second plate line 535 may reduce the number of contacts between plate lines and the substrate 505. For example, instead of a contact being positioned or formed for each individual plate line (e.g., plate line 430-*a*), a single contact may couple the first plate line 530 to the substrate 505. In addition, a single contact may couple the second plate line 535 to the substrate 505. A plate driver may be coupled to every plate line 530, 535 in the memory array 500. The plate drivers may be coupled to the plate lines 530, 535 through the substrate 505 and the contact. The architecture of the memory array 500 may reduce the number of plate drivers in the memory array 500. In some examples, the plate driver may be positioned outside a footprint of the three-dimensional array of ferroelectric memory cells. Additionally or alternatively, an access line may be coupled to the plate driver and may extend from the plate driver to an edge of the footprint of the three-dimensional array. In some examples, the configurations of the first plate line 530 and the second plate line 535 may reduce the amount of die area taken to connect the plate lines of the decks 510, 515 to the substrate.

In some cases, a plate line (or plate node) may be coupled to memory cells 520 that are coupled to different digit lines 525. For example, plate line 530 may be coupled to memory cell 520-*a* and memory cell 520-*b*, where memory cell 520-*a* is coupled to a digit line 525-*a* different from the digit line 525-*b* that is coupled to memory cell 520-*b*. In some examples, a plate line (or plate node) may be coupled to memory cells of a section of the memory array 500. In some examples, a plate line (or plate node) may be coupled to memory cells of a tile of the memory array 500. In some examples, a plate line (or plate node) may be coupled to memory cells of a deck of the memory array 500 (e.g., plate lines 530, 535).

Figure 5B:
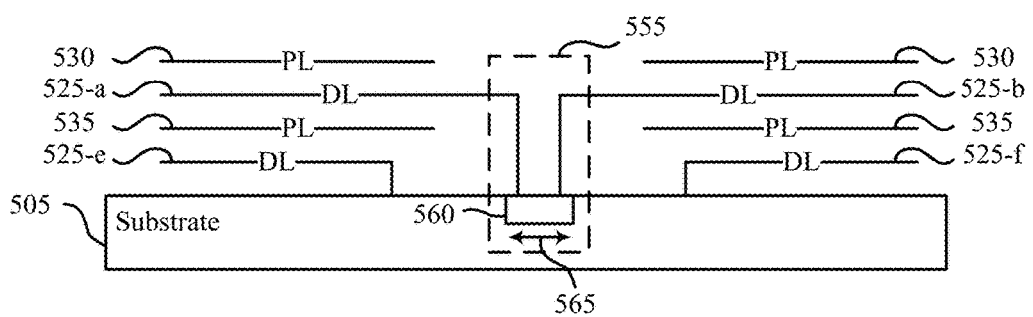
FIG. 5B illustrates an example of a connector that supports plate node configurations and operations for a memory array in accordance with embodiments of the present disclosure.

FIG. 5B illustrates an example of a circuit 550 that supports plate node configurations and operations for a memory array in accordance with embodiments of the present disclosure. The circuit 550 illustrates how a size of a connector 555 may be reduced (as compared to the connector 485) based on the configuration of the plate lines 530, 535. The connector 555 may be configured to couple two cell stacks of components to the substrate 505. For example, the connector 555 may couple multiple digit lines 525 associated with the first deck 510 to the substrate 505.

The connector 555 may be exclusive of plate line contacts. Meaning, the connector 555 may not include any contacts (or vias) that couple the plate lines 530, 535 to the substrate 505. Because the connector 555 may not include any plate line contacts, the size 565 of the connector 555 may be less than the size 495 of the connector 485.

The connector 555 may include a contact for the digit line 525-*a* and a contact for the digit line 525-*b*. The connector 555 may also include a portion 560 of the substrate 505. The size 565 may indicate an amount of area of the memory array 500 used to couple the components and access lines of higher layers or decks to the substrate 505. In some examples, the size 565 may be a first dimension measure along a first axis. In some examples, the size 565 may be a two-dimensional area. In some examples, the size 565 may be a three-dimensional volume. In some examples, the connector 555 may be an example of the connector 470 or the connector 485 described with reference to FIGS. 4B and 4C. The memory array 500 may include a plurality of connectors 555 based at least in part on the number of lines of memory cells in the memory array 500.

By reducing the number of contacts in the connector 555, the die area occupied by the connector 555 may be reduced. In some examples, this may provide additional die area to be occupied by additional memory cells or other components.

The plate lines 530, 535 may be coupled to the substrate at another location different from the connector 555. In some examples, a contact (not shown) may couple the first plate line 530 to the substrate 505. The contact may extend from the first plate line 530, beyond an edge of a footprint of an array of memory cells, and couple to the substrate 505 outside of that footprint. In some examples, the contact may be positioned in the footprint of the array of memory cells, but at a location different from the connector 555. In some examples, the contact between the first plate line 530 and the substrate 505 may be positioned within one of the connectors 555 of the memory array 500. As such, a connector 555 that includes the contact between the first plate line 530 and the substrate 505 may define a size larger than the size 565. A contact (not shown) may couple the second plate line 535 to the substrate 505. Such a contact may be similarly embodied as the contact for the first plate line 530 and a fully description of the features of the contact for the second plate line 535 is not repeated here. In some examples, the plate driver may be positioned outside a footprint of the three-dimensional array of ferroelectric memory cells. Additionally or alternatively, an access line may be coupled to the plate driver and may extend from the plate driver to at least an edge of the footprint of the three-dimensional array. In some examples, the plate driver may be positioned within the footprint of the array of memory cells.

Figure 6:
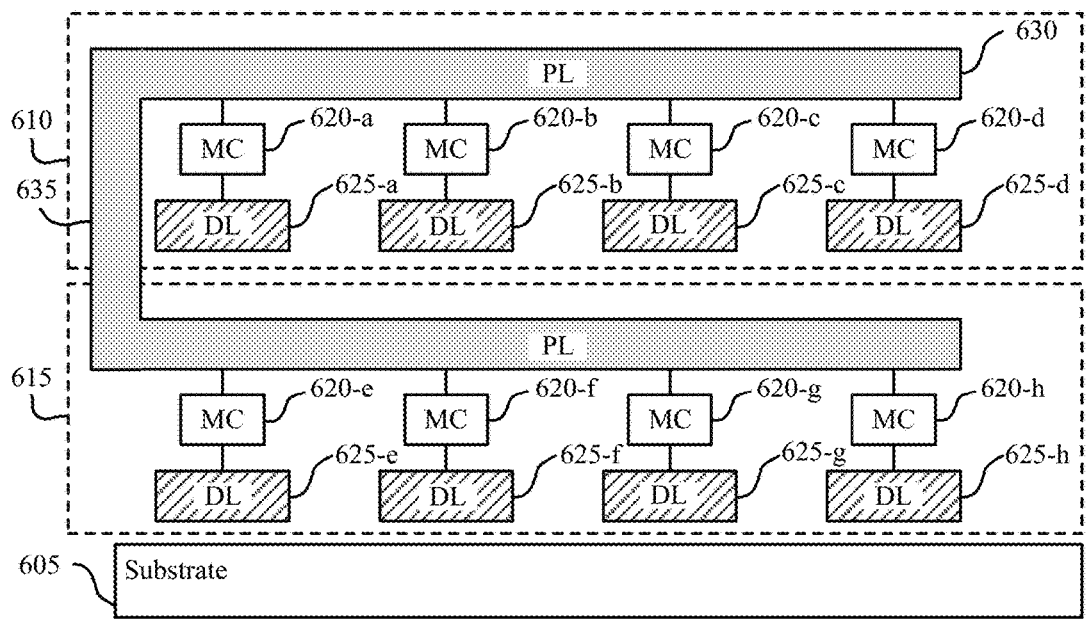
FIG. 6 illustrates examples of memory arrays that support plate node configurations and operations for a memory array in accordance with embodiments of the present disclosure.
Figure 6:
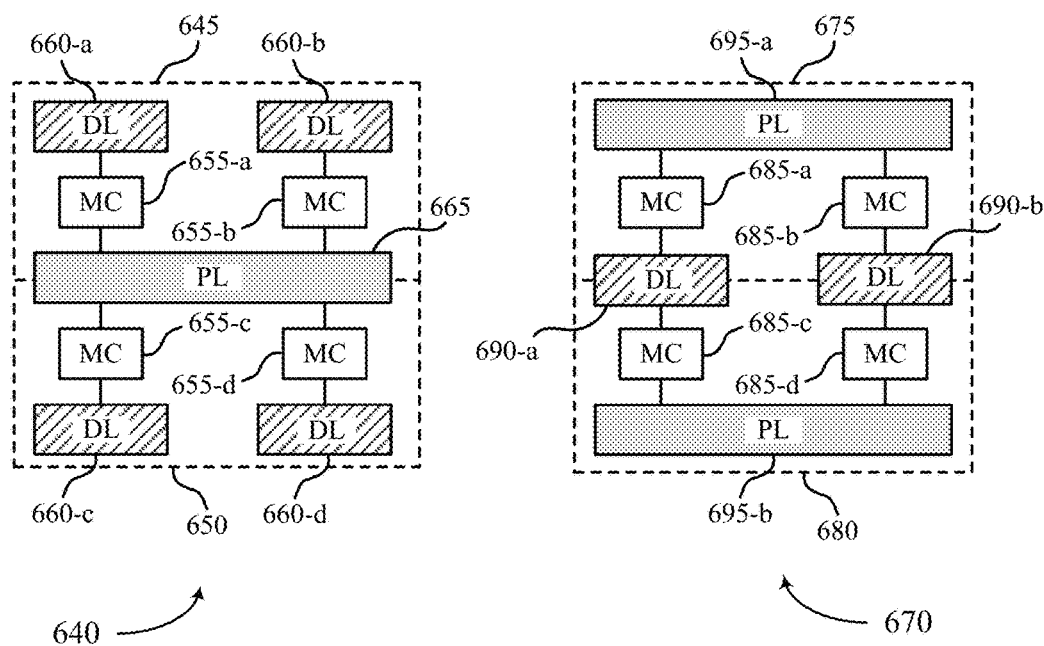

FIG. 6 illustrates examples of memory arrays 600, 640, 670 that supports plate node configurations and operations for a memory array in accordance with various embodiments of the present disclosure. The memory array 600 includes a single plate line 630 associated with both the first deck 610 and the second deck 615 of the memory array 600.

The plate line for the first deck 610 and the plate line for the second deck 615 may be coupled together by a contact 635. In some examples, the contact 635 may be a portion of one continuous plate line 630. In some examples, the contact 635 may be an example of a via extending between two separate plate lines. In some examples, the contact 635 may be an example of a shunt line extending between two separate plate lines.

A contact (not shown) may couple the plate line 630 to the substrate 605. The contact may be an example of the contacts for the first plate line 530 and the second plate line 535 described with reference to FIG. 5B. As such, a full description of the contact is not repeated here.

The memory array 600 may include a connector (not shown) for the digit lines 625. The connector may include contacts that pass through levels that may otherwise be occupied by other components, such as digit lines, memory cells, and plate lines.

The memory array 600 may be an example of the memory arrays 400 and/or 500 described with reference to FIGS. 4-5. As such, full descriptions of at least some of the components of the memory array 600 are not repeated here. The memory array 600 may include a substrate 605, a first deck 610 of memory cells 620, and a second deck 615 of memory cells 620. The memory cells 620 may be coupled to digit lines 625 and to a plate line 630. The substrate 605 may be an example of the substrates 405 and/or 505 described with reference to FIGS. 4-5. The decks 610, 615 of memory cells 620 may be examples of the decks 410, 415, 510, 515 described with reference to FIGS. 4-5. The memory cells 620 may be examples of the memory cells 105, 420, 520 described with reference to FIGS. 1, 2, and 4-5. The digit lines 625 may be examples of the digit lines 115, 425, 525 described with reference to FIGS. 1, 2, and 4-5.

The memory array 640 illustrates an example of a configuration for a memory array. The memory array 640 may include a single shared plate line 665 positioned between the first deck 645 and the second deck 650 of memory cells 655. A contact (not shown) may couple the plate line 630 to a substrate (not shown). The contact may be an example of the contacts for the plate lines 530, 535, 530, 630 described with reference to FIGS. 5-6. As such, a full description of the contact is not repeated here. The memory array 640 may include a connector (not shown) for the digit lines 660. The connector may include contacts that pass through levels that may otherwise be occupied by other components, such as digit lines, memory cells, and plate lines.

The memory array 640 may be an example of the memory arrays 400, 500 and/or 600 described with reference to FIGS. 4-6. The memory array 640 may include a substrate (not shown), a first deck 645 of memory cells 655, and a second deck 650 of memory cells 655. The memory cells 655 may be coupled to digit lines 660 and to a plate line 665. The substrate may be an example of the substrates 405, 505, and/or 605 described with reference to FIGS. 4-6. The decks 645, 650 of memory cells 655 may be examples of the decks 410, 415, 510, 515, 610, 615 described with reference to FIGS. 4-6. The memory cells 655 may be examples of the memory cells 105, 420, 520, 620 described with reference to FIGS. 1, 2, and 4-6. The digit lines 660 may be examples of the digit lines 115, 425, 525, and/or 625 described with reference to FIGS. 1, 2, and 4-6.

The memory array 670 illustrates an example of a configuration for a memory array. The memory array 670 may include a single shared digit lines 690 positioned between the first deck 675 and the second deck 680 of memory cells 685. A contact (not shown) may couple a plate line 695-a to a substrate (not shown). In some examples, the plate line 695-a is coupled to the plate line 695-b to form a single plate associated with both decks 675, 680. The contact may be an example of the contacts for the plate lines 530, 535, 530, 630, 665 described with reference to FIGS. 5-6. As such, a full description of the contact(s) is not repeated here. The memory array 670 may include a connector (not shown) for the digit lines 690. The connector may include contacts that pass through levels that may otherwise be occupied by other components, such as digit lines, memory cells, and plate lines.

The memory array 670 may be an example of the memory arrays 400, 500, 600 and/or 640 described with reference to FIGS. 4-6. As such, full descriptions of at least some of the components of the memory array 670 are not repeated here. The memory array 670 may include a substrate (not shown), a first deck 675 of memory cells 685, and a second deck 680 of memory cells 685. The memory cells 685 may be coupled to digit lines 690 and to plate lines 695. The substrate may be an example of the substrates 405, 505, and/or 605 described with reference to FIGS. 4-6. The decks 675, 680 of memory cells 685 may be examples of the decks 410, 415, 510, 515, 610, 615, 675, 650 described with reference to FIGS. 4-6. The memory cells 685 may be examples of the memory cells 105, 420, 520, 620, 655 described with reference to FIGS. 1, 2, and 4-6. The digit lines 690 may be examples of the digit lines 115, 425, 525, 625 and/or 660 described with reference to FIGS. 1, 2, and 4-6.

In other examples, other configurations of memory arrays are contemplated. For example, the memory arrays 400, 500, 600 may flipped upside-down such that the plate lines are closest to the substrates in each deck rather than the digit lines being closest to the substrates. Each of the memory arrays 500, 600, 640, 670, and/or other configurations of memory arrays may include connectors that define a size that is less than the size 495.

Figure 7:
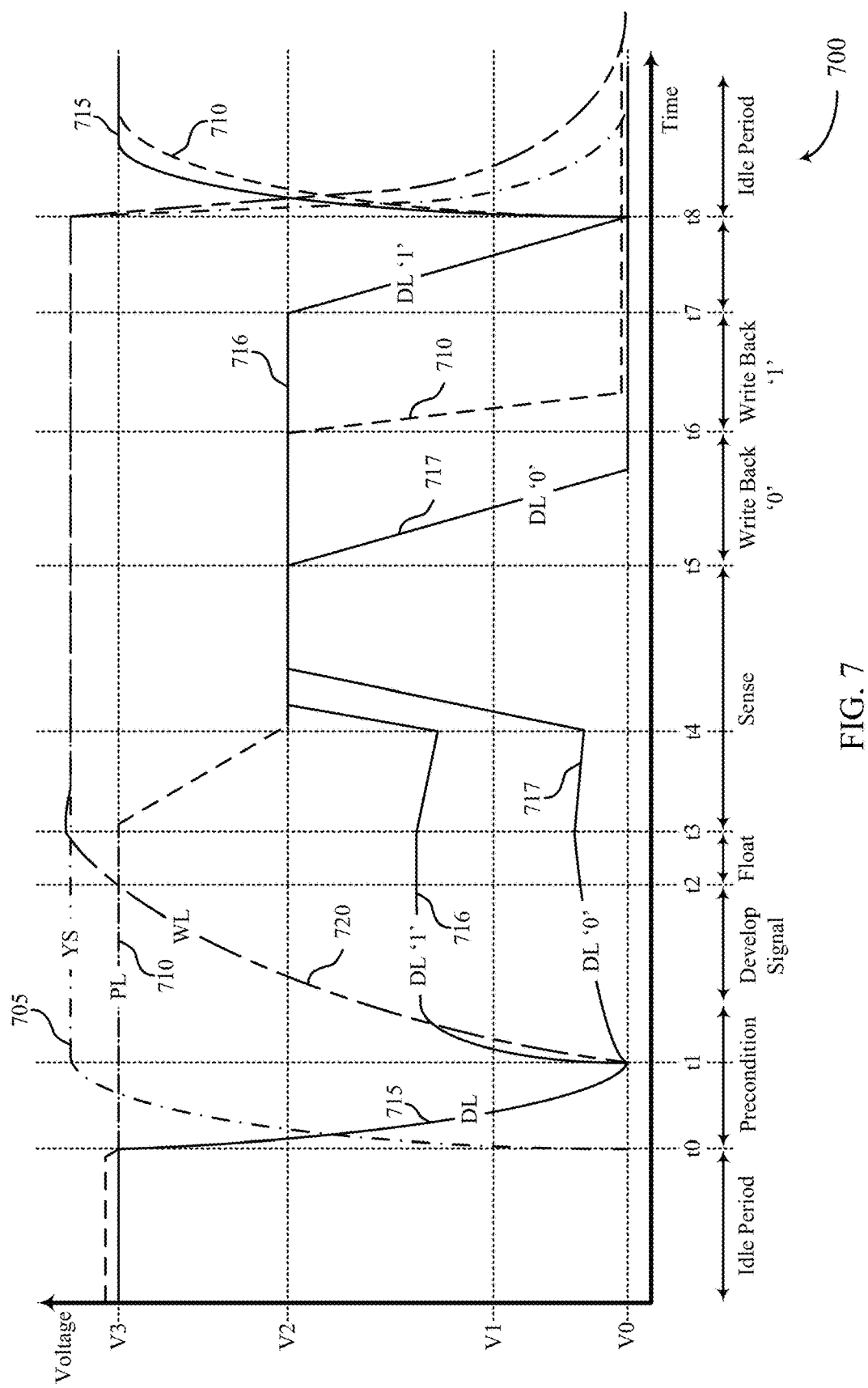
FIG. 7 illustrates an example of a timing diagram that supports plate node configurations and operations for a memory array in accordance with embodiments of the present disclosure.

FIG. 7 illustrates an example of a timing diagram 700 that supports plate node configurations and operations for a memory array in accordance with various embodiments of the present disclosure. The timing diagram 700 illustrates an access operation that may be performed on a memory cell that includes one the plate line configurations discussed with reference to FIGS. 4-6. More specifically, the timing diagram 700 illustrates a read operation performed on a selected memory cell of a memory array (e.g., memory cell 420, 520, 620, 655, 685). The principles of the timing diagram 700 may be applied in the context of a write operation.

At time t0, a memory controller 140 may initiate an access operation on a selected memory cell 105 coupled to a plate line (e.g., plate line 430, 530, 630, 665, 695) and precondition the circuit. The memory controller 140 may select one or more memory cells coupled to the plate line. At time t0, the memory controller 140 may send a select signal 705 from a zero voltage level V0 to a higher voltage level. In some examples the higher voltage level ranges between 2.9 volts and 3.3 volts, 3.0 volts and 3.2 volts, or is about 3.1 volts. The select signal 705 may be associated with selecting the selected memory cell.

Prior to initiating the access operation, the memory controller 140 may maintain the plate line (as represented by plate signal 710) and the digit line (as represented by digit line signal 715) at a non-zero voltage during an idle period. As used herein, an idle period for a selected memory cell may refer to any time period that an access operation is not being performed on the selected memory cell. In some examples, the memory controller 140 may apply a voltage to the plate line and the digit line to maintain them at a third voltage level V3. In some examples, the plate signal 710 and the digit line signal 715 may be maintained a third voltage level V3 greater than the zero voltage level V0. In some examples, the plate signal 710 and the digit line signal 715 may be maintained at a third voltage level V3 that is less than the higher voltage level of the select signal 705. During the idle periods, the plate signal 710 is depicted as offset from the third voltage level V3 for illustrative purposes only. The third voltage level V3 may be configured to bias the selected memory cell during an access operation (e.g., a read operation or a write operation).

At time t0, the memory controller 140 may cause the digit line signal 715 to go from the third voltage level V3 to the zero voltage level V0. The memory controller 140 may discharge the digit line such that the digit line signal 715 goes to the zero voltage level V0. The memory controller 140 may discharge the digit line in preparation for the selected memory cell to dump its charge onto the digit line.

At time t1, the memory controller 140 may begin developing the signal from the selected memory cell. At time t1, the memory controller 140 may activate a selection component (e.g., selection component 220) of the selected memory cell. By activating the selection component, a capacitor of the selected memory cell may be coupled to the digit line. In some examples, the selection component is activated after the memory controller 140 determines that the digit line signal 715 has dropped to the zero voltage level V0.

Depending on the logic state of the selected memory cell, the voltage level seen on the digit line may vary. For example, if the selected memory cell stores a logic '1' as its logic state, the digit line may raise to a higher voltage level than if the selected memory cell stores a logic '0'. Digit line signal 716 represents a voltage level of the digit line when a logic '1' is stored. Digit line signal 717 represents a voltage level of the digit line when a logic '0' is stored.

At time t2, the memory controller 140 may isolate the selected memory cell from a ground or a virtual ground thereby causing the circuit of the memory cell to float. To accomplish this, the memory controller may activate or deactivate various switching components (not shown).

At time t3, the memory controller 140 may activate the sense component (e.g., sense component 125) to sense a logic state of the selected memory cell. To accomplish this, the memory controller 140 may activate or deactivate various switching components (not shown). In addition, at time t3 the memory controller 140 may cause the voltage level of the plate signal 710 to drop to a second voltage level V2 less than the third voltage level V3. In some examples, the second voltage level V2 may be configured to bias the selected memory cell during access operations. Using the sense component, the memory controller 140 may identify the logic state of the selected memory cell based on the voltage level of the digit line (e.g., digit line signal 716 for a logic '1' or digit line signal 717 for a logic '0'). For example, the memory controller 140 may compare the digit line voltage level to a reference voltage (e.g., voltage level V1). If the digit line signal 715 is higher than the reference voltage V1 (e.g., digit line signal 716), the memory controller 140 may identify the logic state as a logic '1.' If the digit line signal 715 is lower than the reference voltage V1 (e.g., digit line signal 717), the memory controller 140 may identify the logic state as a logic '0.'

At time t4, the memory controller 140 may perform a sense portion of the read operation. The memory controller 140 may activate/deactivate a number of switching components (not shown) at time t4. In some examples, the memory controller 140 may perform the sense portion based on the plate signal 710 dropping to the second voltage level V2. In some examples, the digit line signals 716, 717 may rise to the second voltage level V2 at time t4.

At time t5, the memory controller 140 may complete the sensing portion of the read operation and initiate a write back portion of the read operation. In some memory arrays, the act of reading a logic state of a selected memory cell alters the logic state of the selected memory cell. In such situations, a read operation of the selected memory cell may include a write back portion where the sensed logic state is written back to the selected memory cell. At time t5, the memory controller 140 may activate or deactivate a number of switching components (not shown). The precise timing of activating/deactivating these switching components may be based on the logic state of the selected memory cell. For example, if the logic state of the selected memory cell was a logic '0,' at time t5 the memory controller 140 may cause the digit line signal 717 to go from the second voltage level V2 to the zero voltage level V0. At time t5, the memory controller 140 may also maintain the plate signal 710 at the second voltage level V2, thereby biasing the selected memory cell to write a logic '0.'

At time t6, the memory controller 140 may ground or virtually ground the plate line such that the plate signal 710 drops to the zero voltage level V0. At time t6, the memory controller 140 may activate or deactivate a number of switching components (not shown). In some examples, grounding the plate may be based on completing the write back portion of a logic '0.' In some examples, grounding the plate may be performed prior to performing a write operation for a logic '1.' For example, if the logic state of the selected memory cell was a logic '1,' at time t6 the memory controller 140 may drop the plate signal 710 to the zero voltage level V0 form the second voltage level V2. At time t6, the memory controller 140 may also maintain the digit line signal 716 at the second voltage level V2, thereby biasing the selected memory cell to write a logic '1.'

At time t7, the memory controller 140 may complete the write back portions of the read operation. At time t7, the memory controller 140 may ground or virtually ground the digit line. If the digit line carries the digit line signal 717 associated with a logic '0,' such an action may not have much effect on the circuit. If the digit line carries the digit line signal 716 associated with a logic '1,' the digit line may go from a high voltage level (e.g., V2) to a zero voltage level V0.

At time t8, the memory controller 140 may complete the access operation. At time t8, the memory controller 140 may isolate the capacitor of the selected memory cell from the digit line by deactivating the selection component. The memory controller 140 may accomplish by causing the word line signal 720 to drop to the zero voltage level V0. The memory controller 140 may also deselect the selected memory cell, thereby causing the select signal 705 to drop to the zero voltage level V0. In some examples, the time t8 begins another idle period. In some examples, the memory controller 140 may deselect the memory cell based on determining that digit line is at the zero voltage level V0.

At time t8, the memory controller 140 may again apply a voltage to the plate and the digit line based on the access operation being complete. Applying the voltage may cause the digit line signal 715 and the plate signal 710 to raise from the zero voltage level V0 to the third voltage level V3 during the idle period between access operations. In such a manner, the memory controller 140 may maintain the digit line and the plate line at non-zero voltages between access operations performed on the selected memory cell.

Figure 8:
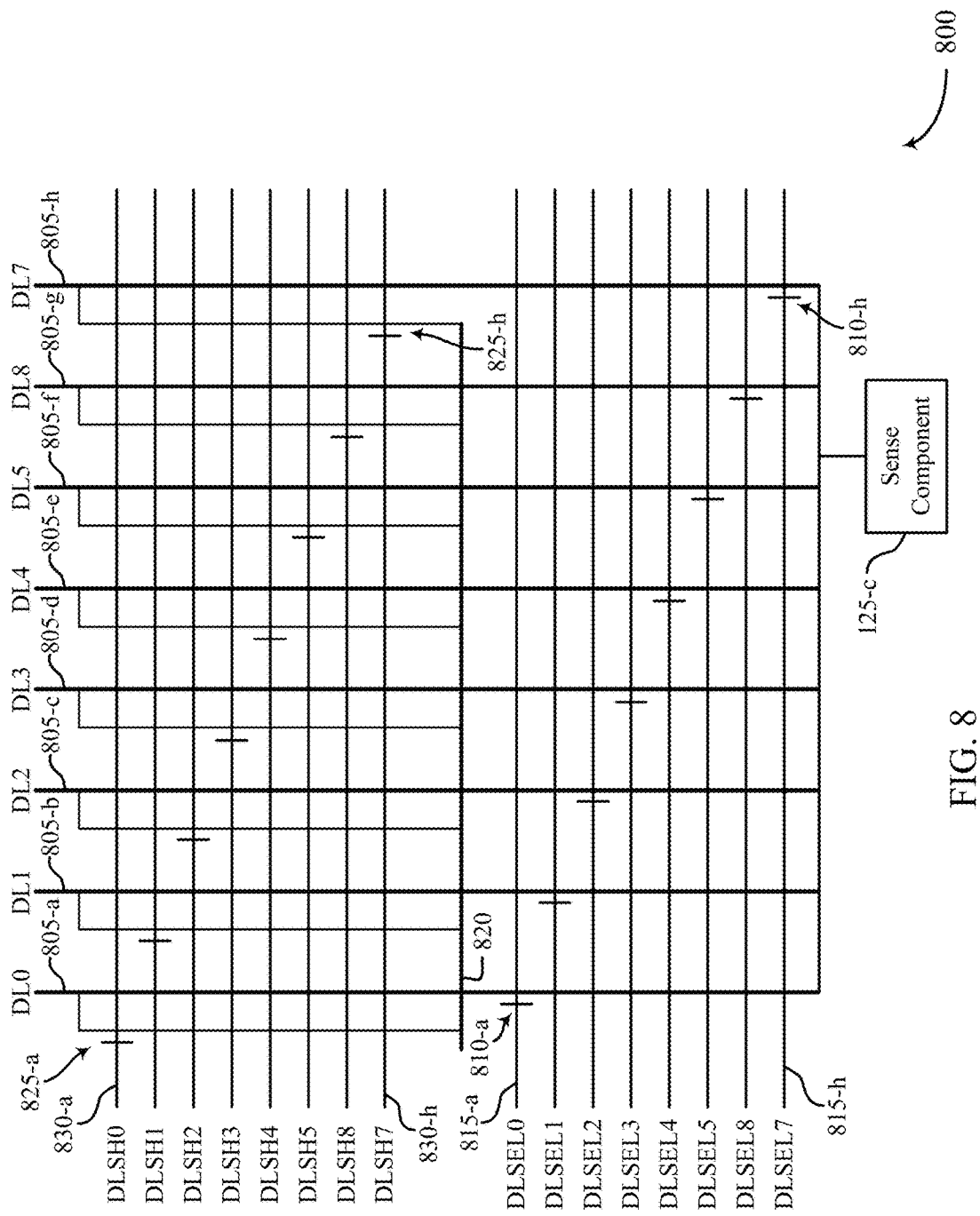
FIG. 8 illustrates an example of a circuit that supports plate node configurations and operations for a memory array in accordance with embodiments of the present disclosure.

FIG. 8 illustrates an example of a circuit 800 that supports plate node configurations and operations for a memory array in accordance with various embodiments of the present disclosure. The circuit 800 may be configured to couple the digit lines 805 of unselected memory cells to the plate line 820. The circuit 800 may be implemented in conjunction with any of the memory arrays 100, 400, 500, 600, 640, 670 described with reference to FIGS. 1-6. The plate line 820 may be an example of the plate lines 210, 430, 530, 535, 630, 665, 695 described with reference to FIGS. 2-6. The digit lines 805 may be examples of the digit lines 115, 425, 525, 625, 660, 690 described with reference to FIGS. 1-6.

In some instances, during an access operation, the plate line 820 may capacitively couple to unselected digit lines 805. Such capacitive coupling may induce transient voltages on the plate 820 or the unselected digit lines 805. The transient voltage may disturb the logic state of the unselected memory cells coupled to the unselected digit lines 805. To mitigate the magnitude and the type of transient voltages, the digit lines 805 may be selectively coupled to the plate 820 by shunt lines and shunt switching components 825. A memory controller 140 may activate a shunt switching component 825-a via the select control line 830-a.

During an access operation, one of the memory cells (not shown) in the circuit 800 may be selected to perform an access operation. As part of the access operation, the digit line 805 associated with the selected memory cell may be coupled to the sense component 125-c. For example, digit line 805-a may be coupled to the sense amplifier using switching component 810-a. A memory controller 140 may activate the switching component 810-a via the select control line 815-a.

In some examples, the sense component 125-c may be coupled to a single memory cell (memory cell associated with digit line 805-a), while the remaining memory cells (memory cells associated with digit lines 805-b through 805-h) are coupled to the plate 820. To achieve this result, the memory controller may activate a single switching component 810 (e.g., switching component 810) and simultaneously activate seven other shunt switching components 825 (e.g., shunt switching components 825-b through 825-h). Such actions may reduce transient voltages induced on unselected digit lines.

In some examples, the memory controller 140 may be configured to equalize voltages of unselected digit lines 805 and the plate line 820. For example, before activating shunt switching components 825, the memory controller may identify a voltage level of the plate line 820 and apply the voltage level of the plate line 820 to the unselected digit lines 805. In some examples, capacitive coupling may be reduced by equalizing voltages of the unselected digit lines 805 with the plate 820 without activating shunt switching components 825.

In some examples, the shunt switching components 825 may in a portion of a substrate 405, 505, 605 below the array described with reference to FIGS. 4-6. The shunt switching components may be part of support components positioned in the substrate 405, 505, 605. In some examples, the shunt switching components 825 may be positioned proximal to an edge of the array. In some examples, the shunt switching components 825 may be coupled to digit lines and/or plate lines through connectors 470/485.

Figure 9:
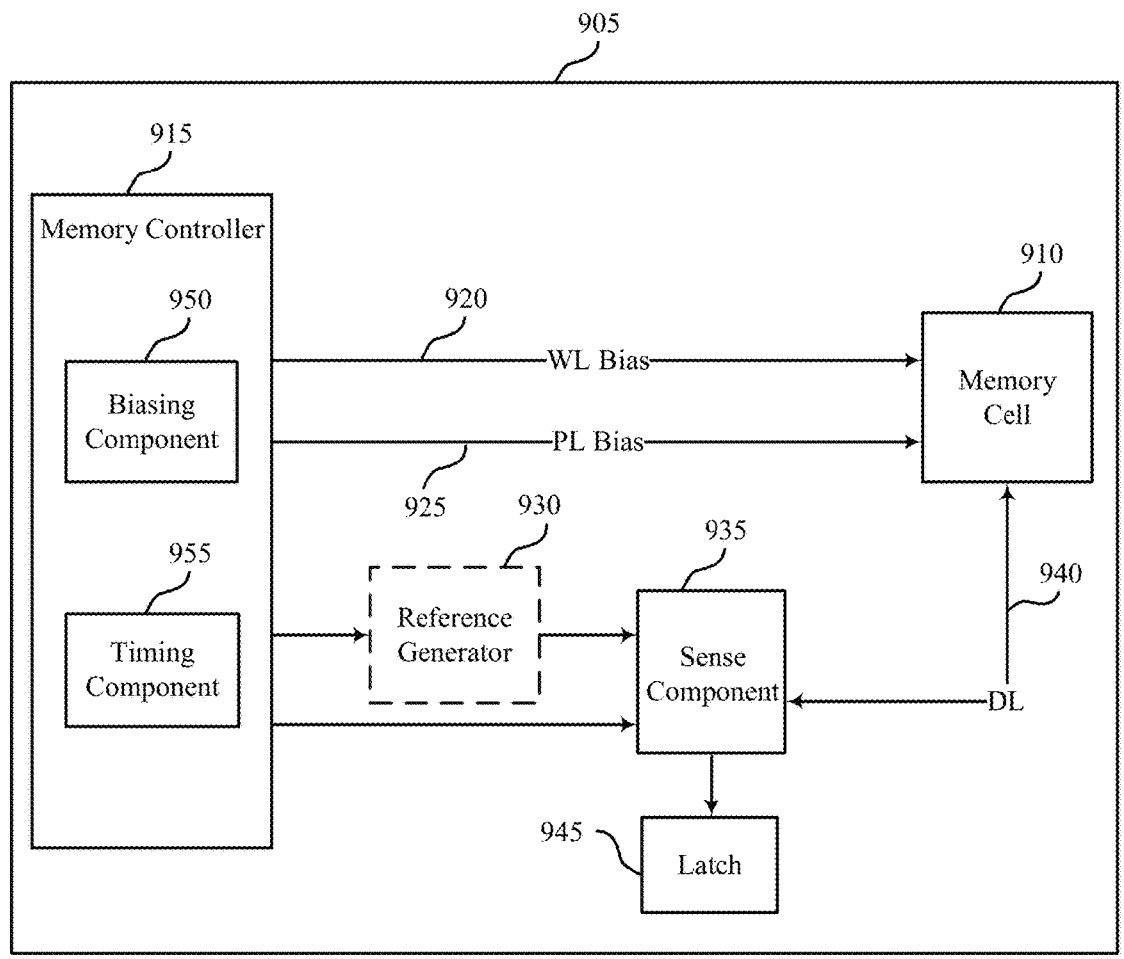
FIGS. 9 through 10 show block diagrams of a device that supports plate node configurations and operations for a memory array in accordance with embodiments of the present disclosure.

FIG. 9 shows a block diagram 900 of a memory array 905 that supports plate node configurations and operations for a memory array in accordance with various embodiments of the present disclosure. Memory array 905 may be referred to as an electronic memory apparatus, and may be an example of a component of a memory controller 140 as described with reference to FIG. 1.

Memory array 905 may include one or more memory cells 910, a memory controller 915, a word line 920, a plate line 925, a reference component 930, a sense component 935, a digit line 940, and a latch 945. These components may be in electronic communication with each other and may perform one or more of the functions described herein. In some cases, memory controller 915 may include biasing component 950 and timing component 955.

Memory controller 915 may be in electronic communication with word line 920, digit line 940, sense component 935, and plate line 925, which may be examples of word line 110, digit line 115, sense component 125, and plate line 210 described with reference to FIGS. 1, and 2. Memory array 905 may also include reference component 930 and latch 945. The components of memory array 905 may be in electronic communication with each other and may perform portions of the functions described with reference to FIGS. 1 through 8. In some cases, reference component 930, sense component 935, and latch 945 may be components of memory controller 915.

In some examples, digit line 940 is in electronic communication with sense component 935 and a ferroelectric capacitor of ferroelectric memory cells 910. A ferroelectric memory cell 910 may be writable with a logic state (e.g., a first or second logic state). Word line 920 may be in electronic communication with memory controller 915 and a selection component of ferroelectric memory cell 910. Plate line 925 may be in electronic communication with memory controller 915 and a plate of the ferroelectric capacitor of ferroelectric memory cell 910. Sense component 935 may be in electronic communication with memory controller 915, digit line 940, latch 945, and reference line 960. Reference component 930 may be in electronic communication with memory controller 915 and reference line 960. Sense control line 965 may be in electronic communication with sense component 935 and memory controller 915. These components may also be in electronic communication with other components, both inside and outside of memory array 905, in addition to components not listed above, via other components, connections, or busses.

Memory controller 915 may be configured to activate word line 920, plate line 925, or digit line 940 by applying voltages to those various nodes. For example, biasing component 950 may be configured to apply a voltage to operate memory cell 910 to read or write memory cell 910 as described above. In some cases, memory controller 915 may include a row decoder, column decoder, or both, as described with reference to FIG. 1. This may enable memory controller 915 to access one or more memory cells 105. Biasing component 950 may also provide voltage potentials to reference component 930 in order to generate a reference signal for sense component 935. Additionally, biasing component 950 may provide voltage potentials for the operation of sense component 935.

In some cases, memory controller 915 may perform its operations using timing component 955. For example, timing component 955 may control the timing of the various word line selections or plate biasing, including timing for switching and voltage application to perform the memory functions, such as reading and writing, discussed herein. In some cases, timing component 955 may control the operations of biasing component 950.

Reference component 930 may include various components to generate a reference signal for sense component 935. Reference component 930 may include circuitry configured to produce a reference signal. In some cases, reference component 930 may be implemented using other ferroelectric memory cells 105. Sense component 935 may compare a signal from memory cell 910 (through digit line 940) with a reference signal from reference component 930. Upon determining the logic state, the sense component may then store the output in latch 945, where it may be used in accordance with the operations of an electronic device that memory array 905 is a part. Sense component 935 may include a sense amplifier in electronic communication with the latch and the ferroelectric memory cell.

Memory controller 915 may be an example of portions of the memory controller 1115 described with reference to FIG. 11. Memory controller 915 and/or at least some of its various sub-components may be implemented in hardware, software executed by a processor, firmware, or any combination thereof. If implemented in software executed by a processor, the functions of the memory controller 915 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 915 and/or at least some of its various sub-components may be physically located at various positions, including being distributed such that portions of functions are implemented at different physical locations by one or more physical devices. In some examples, memory controller 915 and/or at least some of its various sub-components may be a separate and distinct component in accordance with various embodiments of the present disclosure. In other examples, memory controller 915 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Memory controller 915 may apply a first voltage to a plate and an access line that are each coupled to a ferroelectric memory cell during a time period preceding an access operation for the ferroelectric memory cell, select the ferroelectric memory cell for the access operation via a second access line that is coupled to the ferroelectric memory cell, and discharge the access line based on selecting the ferroelectric memory cell for the access operation. In some examples, the memory controller 915 may couple the plate line 925 to unselected digit lines associated with the plate line 925. In some cases, the memory controller 915 may activate a plurality of shunt switching components coupled to the plate line 925 and the unselected digit lines. In some cases, the memory controller 915 may identify a voltage level of the plate line 925. In some cases, the memory controller 915 may apply the voltage level of the plate line 925 to the unselected digit lines while the plate line 925 is coupled to the unselected digit lines.

In some cases, the memory array 905 may include various means for operating the memory array 905. For example, the memory array 905 and/or the memory controller 915 may include means for performing the functions described above with reference to FIG. 10.

The memory array 905 may include means for applying a first voltage to a plate and an access line that are each coupled to a ferroelectric memory cell during a time period preceding an access operation for the ferroelectric memory cell, means for selecting the ferroelectric memory cell for the access operation via a second access line that is coupled to the ferroelectric memory cell, and means for discharging the access line based at least in part on selecting the ferroelectric memory cell for the access operation.

Some examples of the memory array 905 described above may further include processes, features, means, or instructions for maintaining the first voltage on the plate while the access line may be discharged. Some examples of the memory array 905 described above may further include processes, features, means, or instructions for activating a selection component of the ferroelectric memory cell based at least in part on the ferroelectric memory cell being selected and the access line being discharged.

Some examples of the memory array 905 described above may further include processes, features, means, or instructions for discharging a ferroelectric capacitor of the ferroelectric memory cell onto the access line as part of the access operation based at least in part on the access line being discharged. Some examples of the memory array 905 described above may further include processes, features, means, or instructions for discharging the plate from the first voltage to a second voltage less than the first voltage based at least in part on activating a sense component coupled to the access line.

Some examples of the memory array 905 described above may further include processes, features, means, or instructions for sensing a second voltage on the access line as part of the access operation based at least in part on activating a sense component coupled to the access line, the second voltage associated with a charge of the ferroelectric memory cell.

Some examples of the memory array 905 described above may further include processes, features, means, or instructions for coupling the plate to unselected access lines associated with the plate. In some examples of the memory array 905 described above, coupling the plate further comprises: activating a plurality of shunt switching components coupled to the plate and the unselected access lines.

Some examples of the memory array 905 described above may further include processes, features, means, or instructions for identifying a voltage level of the plate. Some examples of the method and apparatus described above may further include processes, features, means, or instructions for applying the voltage level of the plate to the unselected access lines while the plate may be coupled to the unselected access lines.

Some examples of the memory array 905 described above may further include processes, features, means, or instructions for discharging the plate during a write back portion of the access operation. Some examples of the memory array 905 described above may further include processes, features, means, or instructions for applying the first voltage to the plate and the access line based at least in part on the access operation being complete. In some examples of the memory array 905 described above, the plate and the access line may be maintained at a non-zero voltage between access operations performed on the ferroelectric memory cell.

Figure 10:
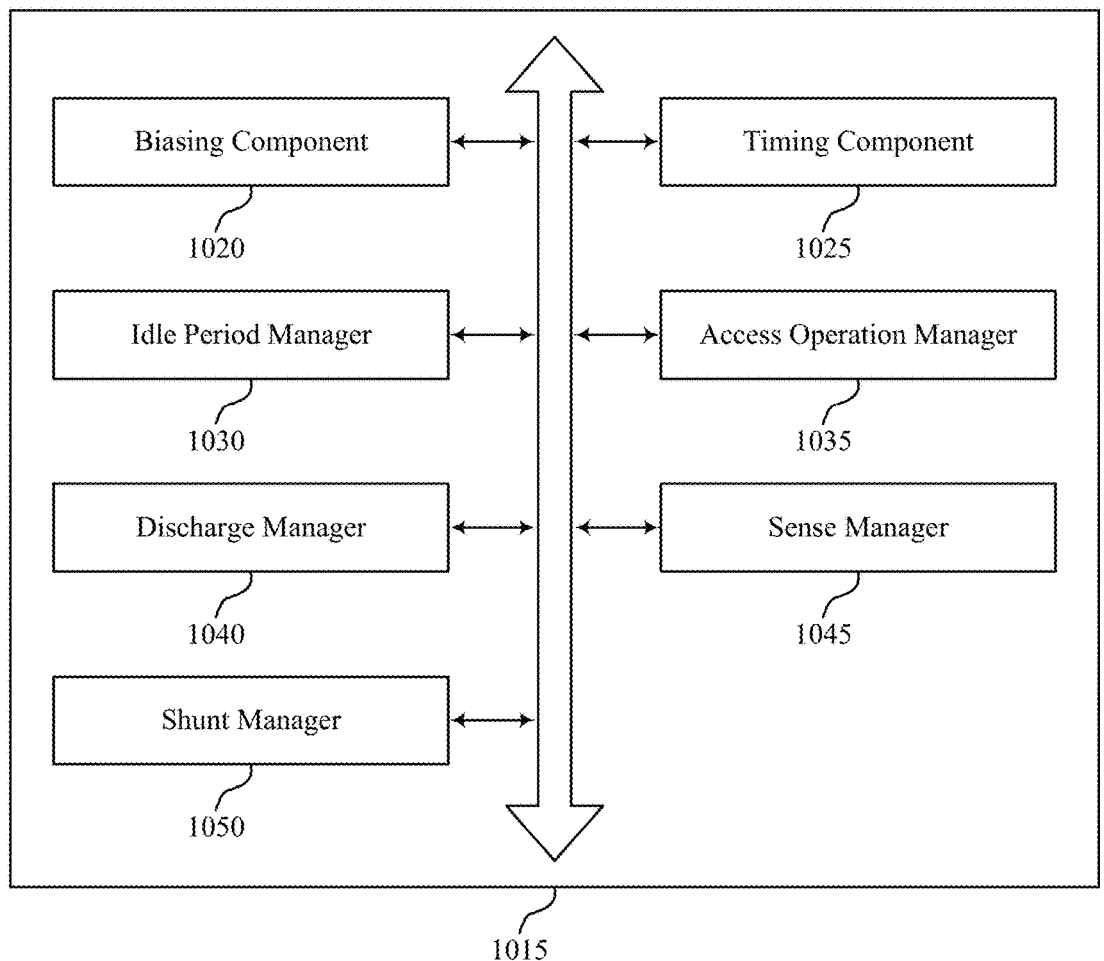

FIG. 10 shows a block diagram 1000 of a memory controller 1015 that supports plate node configurations and operations for a memory array in accordance with various embodiments of the present disclosure. The memory controller 1015 may be an example of portions of a memory controller 140, 915, or 1115 described with reference to FIGS. 1, 9, and 11. The memory controller 1015 may include biasing component 1020, timing component 1025, idle period manager 1030, access operation manager 1035, discharge manager 1040, sense manager 1045, and shunt manager 1050. Each of these modules may communicate, directly or indirectly, with one another (e.g., via one or more buses).

Idle period manager 1030 may apply a first voltage to a plate node and a digit line that are each coupled to a ferroelectric memory cell during a time period preceding an access operation for the ferroelectric memory cell and apply the first voltage to the plate node and the digit line based on the access operation being complete. In some cases, the plate node and the digit line are maintained at a non-zero voltage between access operations performed on the ferroelectric memory cell.

Access operation manager 1035 may select the ferroelectric memory cell for the access operation via a word line that is coupled to the ferroelectric memory cell, activate a selection component of the ferroelectric memory cell based on the ferroelectric memory cell being selected and the digit line being discharged, and discharge the plate node from the first voltage to a second voltage less than the first voltage based on activating a sense component coupled to the digit line.

Discharge manager 1040 may discharge the digit line based on selecting the ferroelectric memory cell for the access operation, maintain the first voltage on the plate node while the digit line is discharged, and discharge the plate node during a write back portion of the access operation.

Sense manager 1045 may discharge a ferroelectric capacitor of the ferroelectric memory cell onto the digit line as part of the access operation based on the digit line being discharged and sense a second voltage on the digit line as part of the access operation based on activating a sense component coupled to the digit line, the second voltage associated with a charge of the ferroelectric memory cell.

Shunt manager 1050 may couple the plate node to unselected digit lines associated with the plate node, identify a voltage level of the plate node, and apply the voltage level of the plate node to the unselected digit lines while the plate node is coupled to the unselected digit lines. In some cases, coupling the plate node further includes: activating a set of shunt switching components coupled to the plate node and the unselected digit lines.

Figure 11:
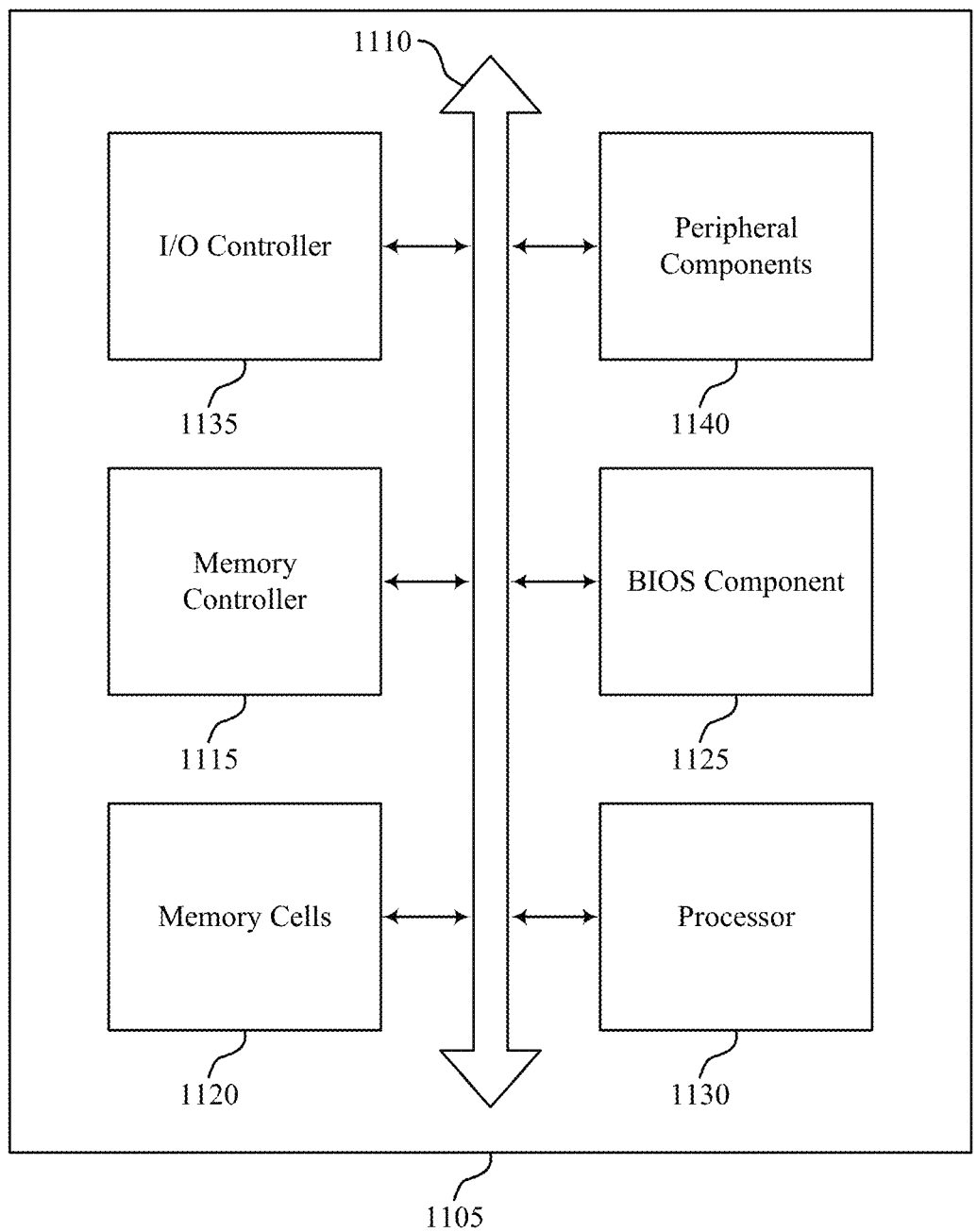
FIG. 11 illustrates a block diagram of a system including a memory controller that supports plate node configurations and operations for a memory array in accordance with embodiments of the present disclosure.

FIG. 11 shows a diagram of a system 1100 including a device 1105 that supports plate node configurations and operations for a memory array in accordance with various embodiments of the present disclosure. Device 1105 may be an example of or include the components of memory controller 140 or memory controller 915 as described above, e.g., with reference to FIGS. 1 and 9. Device 1105 may include components for bi-directional voice and data communications including components for transmitting and receiving communications, including memory controller 1115, memory cells 1120, basic input/output system (BIOS) component 1125, processor 1130, I/O controller 1135, and peripheral components 1140. These components may be in electronic communication via one or more busses (e.g., bus 1110).

Memory controller 1115 may operate one or more memory cells as described herein. Specifically, memory controller 1115 may be configured to support plate configurations and operations for a memory array. In some cases, memory controller 1115 may include a row decoder, column decoder, or both, as described with reference to FIG. 1 (not shown). Memory cells 1120 may store information (i.e., in the form of a logic state) as described herein.

BIOS component 1125 be a software component that includes BIOS operated as firmware, which may initialize and run various hardware components. BIOS component 1125 may also manage data flow between a processor and various other components, e.g., peripheral components, input/output control component, etc. BIOS component 1125 may include a program or software stored in read only memory (ROM), flash memory, or any other non-volatile memory.

Processor 1130 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1130 may be configured to operate a memory array using a memory controller. In other cases, a memory controller may be integrated into processor 1130. Processor 1130 may be configured to execute computer-readable instructions stored in a memory to perform various functions (e.g., functions or tasks supporting plate configurations and operations for a memory array).

I/O controller 1135 may manage input and output signals for device 1105. I/O controller 1135 may also manage peripherals not integrated into device 1105. In some cases, I/O controller 1135 may represent a physical connection or port to an external peripheral. In some cases, I/O controller 1135 may utilize an operating system such as iOS®, ANDROID®, MS-DOS®, MS-WINDOWS®, OS/2®, UNIX®, LINUX®, or another known operating system. In other cases, I/O controller 1135 may represent or interact with a modem, a keyboard, a mouse, a touchscreen, or a similar device. In some cases, I/O controller 1135 may be implemented as part of a processor. In some cases, a user may interact with device 1105 via I/O controller 1135 or via hardware components controlled by I/O controller 1135.

Peripheral components 1140 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Figure 12:
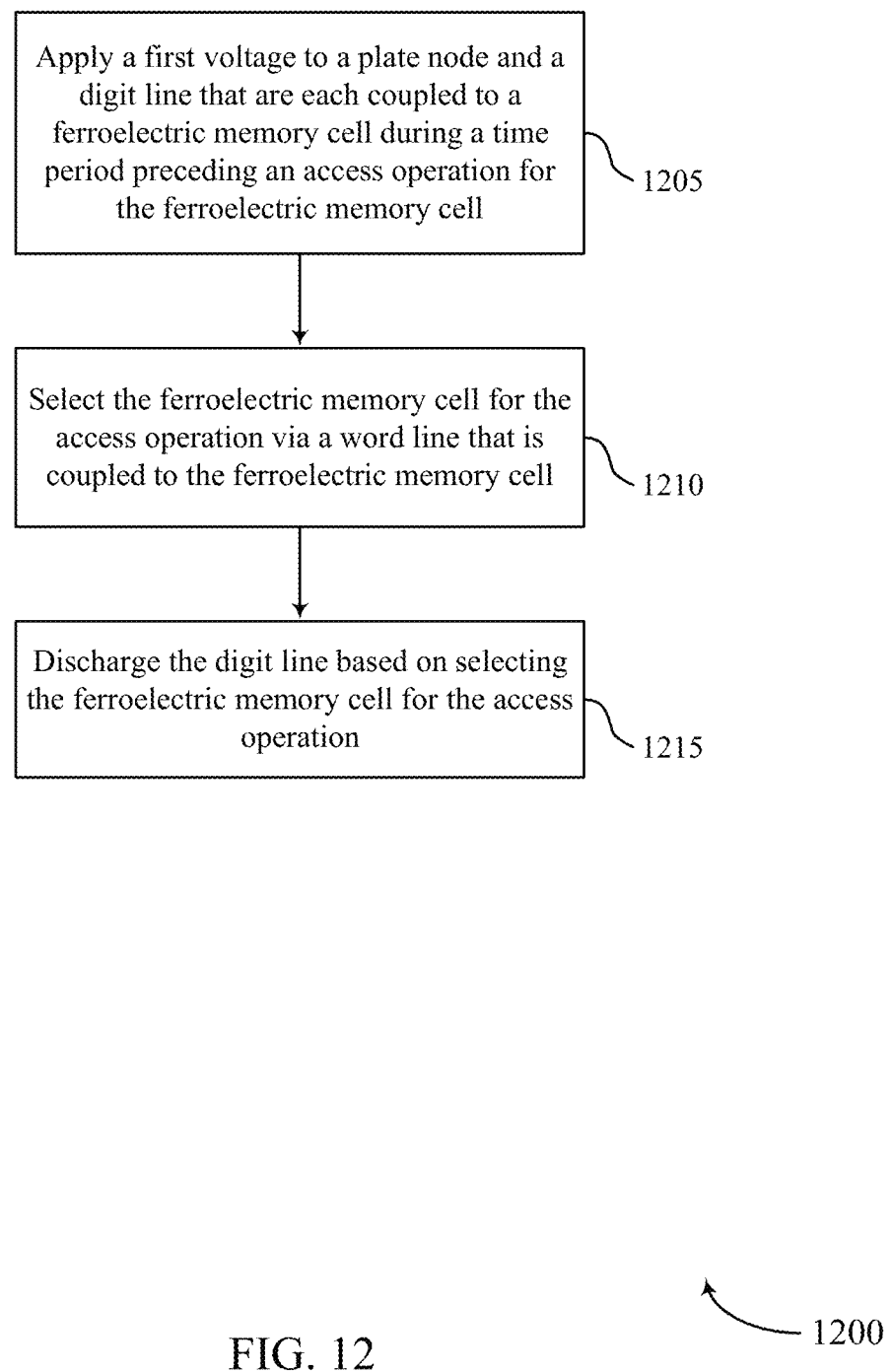
FIGS. 12 through 13 illustrate methods for plate node configurations and operations for a memory array in accordance with embodiments of the present disclosure.

FIG. 12 shows a flowchart illustrating a method 1200 for plate node configurations and operations for a memory array in accordance with various embodiments of the present disclosure. The operations of method 1200 may be implemented by a memory controller 915 or its components as described herein. For example, the operations of method 1200 may be performed by a memory controller as described with reference to FIGS. 9 through 11. In some examples, a memory controller 915 may execute a set of codes to control the functional elements of the device to perform the functions described below. Additionally or alternatively, the memory controller 915 may perform portions of the functions described below using special-purpose hardware.

At block 1205, the memory controller 915 may apply a first voltage to a plate node and a digit line that are each coupled to a ferroelectric memory cell during a time period preceding an access operation for the ferroelectric memory cell. The operations of block 1205 may be performed according to the methods described with reference to FIGS. 1-13. In certain examples, portions of the operations of block 1205 may be performed by an idle period manager as described with reference to FIGS. 9 through 11.

At block 1210, the memory controller 915 may select the ferroelectric memory cell for the access operation via a word line that is coupled to the ferroelectric memory cell. The operations of block 1210 may be performed according to the methods described with reference to FIGS. 1-13. In certain examples, portions of the operations of block 1210 may be performed by an access operation manager as described with reference to FIGS. 9 through 11.

At block 1215, the memory controller 915 may discharge the digit line based at least in part on selecting the ferroelectric memory cell for the access operation. The operations of block 1215 may be performed according to the methods described with reference to FIGS. 1-13. In certain examples, portions of the operations of block 1215 may be performed by a discharge manager as described with reference to FIGS. 9 through 11.

In some cases, the method may also include applying a first voltage to a plate node and digit line that are each coupled to a ferroelectric memory cell during a time period preceding an access operation for the ferroelectric memory cell. In some cases, the plate and the digit line are maintained at a non-zero voltage between access operations performed on the ferroelectric memory cell. In some cases, the method may also include discharging the digit line based at least in part on selecting the ferroelectric memory cell for the access operation. In some cases, the method may also include maintaining the first voltage on the plate node while the digit line is discharged. In some cases, the method may also include activating a selection component of the ferroelectric memory cell based at least in part on the ferroelectric memory cell being selected and the digit line being discharged. In some cases, the method may also include discharging a ferroelectric capacitor of the ferroelectric memory cell onto the digit line as part of the access operation based at least in part on the digit line being discharged.

In some cases, the method may also include discharging the plate node from the first voltage to a second voltage less than the first voltage based at least in part on activating a sense component coupled to the digit line. In some cases, the method may also include selecting the ferroelectric memory cell for the access operation via a word line that is coupled to the ferroelectric memory cell. In some cases, the method may also include coupling the plate node to unselected digit lines associated with the plate node. In some cases, coupling the plate node further comprises: activating a plurality of shunt switching components coupled to the plate node and the unselected digit lines. In some cases, the method may also include identifying a voltage level of the plate node. In some cases, the method may also include applying the voltage level of the plate node to the unselected digit lines while the plate node is coupled to the unselected digit lines.

In some cases, the method may also include discharging the plate node during a write back portion of the access operation. In some cases, the method may also include applying the first voltage to the plate node and the digit line based at least in part on the access operation being complete. In some cases, the method may also include sensing a second voltage on the digit line as part of the access operation based at least in part on activating a sense component coupled to the digit line, the second voltage associated with a charge of the ferroelectric memory cell.

Figure 13:
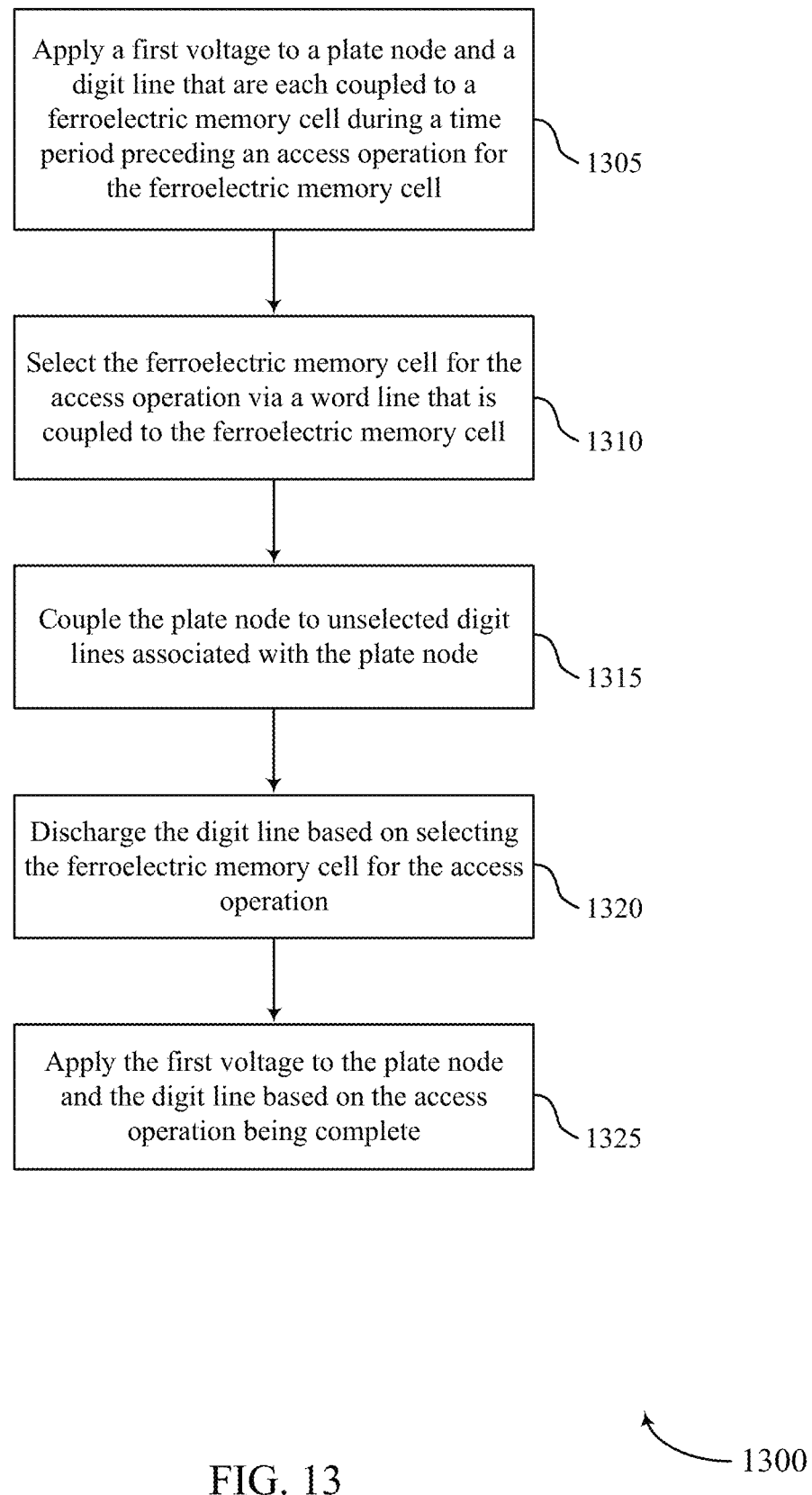

FIG. 13 shows a flowchart illustrating a method 1300 for plate node configurations and operations for a memory array in accordance with various embodiments of the present disclosure. The operations of method 1300 may be implemented by a memory controller 915 or its components as described herein. For example, the operations of method 1300 may be performed by a memory controller as described with reference to FIGS. 9 through 11. In some examples, a memory controller 915 may execute a set of codes to control the functional elements of the device to perform the functions described below. Additionally or alternatively, the memory controller 915 may perform portions of the functions described below using special-purpose hardware.

At block 1305, the memory controller 915 may apply a first voltage to a plate node and a digit line that are each coupled to a ferroelectric memory cell during a time period preceding an access operation for the ferroelectric memory cell. The operations of block 1305 may be performed according to the methods described with reference to FIGS. 1-13. In certain examples, portions of the operations of block 1305 may be performed by an idle period manager as described with reference to FIGS. 9 through 11.

At block 1310, the memory controller 915 may select the ferroelectric memory cell for the access operation via a word line that is coupled to the ferroelectric memory cell. The operations of block 1310 may be performed according to the methods described with reference to FIGS. 1-13. In certain examples, portions of the operations of block 1310 may be performed by an access operation manager as described with reference to FIGS. 9 through 11.

At block 1315, the memory controller 915 may couple the plate node to unselected digit lines associated with the plate node. The operations of block 1315 may be performed according to the methods described with reference to FIGS. 1-13. In certain examples, portions of the operations of block 1315 may be performed by an access operation manager as described with reference to FIGS. 9 through 11.

At block 1320, the memory controller 915 may discharge the digit line based at least in part on selecting the ferroelectric memory cell for the access operation. The operations of block 1320 may be performed according to the methods described with reference to FIGS. 1-13. In certain examples, portions of the operations of block 1320 may be performed by a discharge manager as described with reference to FIGS. 9 through 11.

At block 1325, the memory controller 915 may apply the first voltage to the plate node and the digit line based at least in part on the access operation being complete. The operations of block 1325 may be performed according to the methods described with reference to FIGS. 1-13. In certain examples, portions of the operations of block 1325 may be performed by an idle period manager as described with reference to FIGS. 9 through 11.

An apparatus is described. The apparatus may include means for applying a first voltage to a plate node and a digit line that are each coupled to a ferroelectric memory cell during a time period preceding an access operation for the ferroelectric memory cell, means for selecting the ferroelectric memory cell for the access operation via a word line that is coupled to the ferroelectric memory cell, and means for discharging the digit line based at least in part on selecting the ferroelectric memory cell for the access operation.

Some examples may further include means for coupling the plate node to unselected digit lines associated with the plate node. Some examples may further include means for maintaining the first voltage on the plate node while the digit line may be discharged. Some examples may further include means for activating a selection component of the ferroelectric memory cell based at least in part on the ferroelectric memory cell being selected and the digit line being discharged. Some examples may further include means for discharging a ferroelectric capacitor of the ferroelectric memory cell onto the digit line as part of the access operation based at least in part on the digit line being discharged.

Some examples may further include means for discharging the plate node from the first voltage to a second voltage less than the first voltage based at least in part on activating a sense component coupled to the digit line. Some examples may further include means for sensing a second voltage on the digit line as part of the access operation based at least in part on activating a sense component coupled to the digit line, the second voltage associated with a charge of the ferroelectric memory cell.

In some examples, coupling the plate node further comprises means for activating a plurality of shunt switching components coupled to the plate node and the unselected digit lines. Some examples may further include means for identifying a voltage level of the plate node. Some examples may further include means for applying the voltage level of the plate node to the unselected digit lines while the plate node may be coupled to the unselected digit lines. Some examples may further include means for discharging the plate node during a write back portion of the access operation.

Some examples may further include means for applying the first voltage to the plate node and the digit line based at least in part on the access operation being complete. In some examples, the plate node and the digit line may be maintained at a non-zero voltage between access operations performed on the ferroelectric memory cell.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured to and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An electronic memory apparatus, comprising:
    a three-dimensional array of ferroelectric memory cells having a first deck of ferroelectric memory cells and a second deck of ferroelectric memory cells;
    a plate node coupled to a first ferroelectric memory cell coupled to a first digit line and a second ferroelectric memory cell coupled to a second digit line different from the first digit line; and
    a plate driver coupled to the plate node, the plate driver operable to adjust a voltage of the plate node, wherein the plate node comprises a first portion coupled to the first deck of ferroelectric memory cells and a second portion coupled to the second deck of ferroelectric memory cells, the second portion of the plate node is coupled to the first portion of the plate node through a via structure between the first deck and the second deck.

2. The electronic memory apparatus of claim 1, wherein: the plate node is coupled to the first deck of ferroelectric memory cells and the second deck of ferroelectric memory cells.

3. The electronic memory apparatus of claim 1, wherein: the plate node comprises a sheet coupled to multiple rows or multiple columns of ferroelectric memory cells of the first deck and to multiple rows or multiple columns of ferroelectric memory cells of the second deck in the three-dimensional array.

4. The electronic memory apparatus of claim 1, wherein: the plate driver is positioned outside a footprint of the three-dimensional array of ferroelectric memory cells.

5. The electronic memory apparatus of claim 4, further comprising:
    an access line coupled to the plate driver, the access line extending from the plate driver to at least an edge of the footprint of the three-dimensional array.

6. The electronic memory apparatus of claim 1, further comprising:
    a connector associated with two ferroelectric memory cells of the first deck and two ferroelectric memory cells of the second deck, the connector configured to couple the associated ferroelectric memory cells to one or more digit lines.

7. The electronic memory apparatus of claim 6, wherein the connector further comprises:
    a first connection coupling the first ferroelectric memory cell of the first deck to the first digit line; and
    a second connection coupling the second ferroelectric memory cell of the first deck to the second digit line.

8. The electronic memory apparatus of claim 6, wherein:
    the connector is exclusive of a connection coupling the plate node to the associated ferroelectric memory cells.

9. The electronic memory apparatus of claim 6, wherein:
    the two ferroelectric memory cells of the second deck are coupled to respective digit lines independent of the connector.

10. The electronic memory apparatus of claim 1, further comprising:
    a plurality of switching components coupled to a sense component and a plurality of digit lines, each switching component coupled to a respective digit line of the plurality of digit lines, each switching component configured to selectively couple the respective digit line to the sense component based at least in part on an access operation being performed using the respective digit line.

11. The electronic memory apparatus of claim 1, further comprising:
    a plurality of shunt switching components coupled to the plate node and a plurality of digit lines, each shunt switching component coupled to a respective digit line of the plurality of digit lines, each shunt switching component configured to selectively couple the respective digit line to the plate node based at least in part on an access operation not being performed using the respective digit line.

12. The electronic memory apparatus of claim 11, wherein:
    the plurality of shunt switching components are in a portion of a substrate below the three-dimensional array.

13. An electronic memory apparatus, comprising:
    a three-dimensional array of ferroelectric memory cells having a first deck of ferroelectric memory cells and a second deck of ferroelectric memory cells;
    a plate node coupled to a first ferroelectric memory cell coupled to a first digit line and a second ferroelectric memory cell coupled to a second digit line different from the first digit line;
    a plate driver coupled to the plate node, the plate driver operable to adjust a voltage of the plate node; and
    a plurality of shunt switching components coupled to the plate node and a plurality of digit lines, each shunt switching component coupled to a respective digit line of the plurality of digit lines, each shunt switching component configured to selectively couple the respective digit line to the plate node based at least in part on an access operation not being performed using the respective digit line, wherein the plurality of shunt switching components are in a portion of a substrate below the three-dimensional array.

14. The electronic memory apparatus of claim 13, wherein:
    the plate node is coupled to the first deck of ferroelectric memory cells and the second deck of ferroelectric memory cells.

15. The electronic memory apparatus of claim 13, wherein:
    the plate node comprises a sheet coupled to multiple rows or multiple columns of ferroelectric memory cells of the first deck and to multiple rows or multiple columns of ferroelectric memory cells of the second deck in the three-dimensional array.

16. The electronic memory apparatus of claim 13, wherein:

the plate driver is positioned outside a footprint of the three-dimensional array of ferroelectric memory cells.

17. The electronic memory apparatus of claim 16, further comprising:

an access line coupled to the plate driver, the access line extending from the plate driver to at least an edge of the footprint of the three-dimensional array.

18. The electronic memory apparatus of claim 13, wherein the plate node comprises:

a first portion coupled to the first deck of ferroelectric memory cells; and a second portion coupled to the second deck of ferroelectric memory cells.

19. The electronic memory apparatus of claim 13, further comprising:

a connector associated with two ferroelectric memory cells of the first deck and two ferroelectric memory cells of the second deck, the connector configured to couple the associated ferroelectric memory cells to one or more digit lines.

20. The electronic memory apparatus of claim 19, wherein the connector further comprises:

a first connection coupling the first ferroelectric memory cell of the first deck to the first digit line; and a second connection coupling the second ferroelectric memory cell of the first deck to the second digit line.

21. The electronic memory apparatus of claim 19, wherein:

the connector is exclusive of a connection coupling the plate node to the associated ferroelectric memory cells.

22. The electronic memory apparatus of claim 19, wherein:

the two ferroelectric memory cells of the second deck are coupled to respective digit lines independent of the connector.

23. The electronic memory apparatus of claim 13, further comprising:

a plurality of switching components coupled to a sense component and the plurality of digit lines, each switching component coupled to a second respective digit line of the plurality of digit lines, each switching component configured to selectively couple the second respective digit line to the sense component based at least in part on an access operation being performed using the second respective digit line.

\* \* \* \* \*